United States Patent [19]
Jones

[11] Patent Number: 5,903,243
[45] Date of Patent: *May 11, 1999

[54] COMPACT, BODY-MOUNTABLE FIELD EMISSION DISPLAY DEVICE, AND DISPLAY PANEL HAVING UTILITY FOR USE THEREWITH

[75] Inventor: Gary W. Jones, Raleigh, N.C.

[73] Assignee: Fed Corporation, Hopewell Junction, N.Y.

[ * ] Notice: This patent issued on a continued prosecution application filed under 37 CFR 1.53(d), and is subject to the twenty year patent term provisions of 35 U.S.C. 154(a)(2).

[21] Appl. No.: 08/778,747

[22] Filed: Jan. 6, 1997

Related U.S. Application Data

[63] Continuation of application No. 08/290,238, Aug. 15, 1994, abandoned, which is a continuation-in-part of application No. 08/029,880, Mar. 11, 1993, abandoned.

[51] Int. Cl.⁶ ..................................................... G09G 5/00
[52] U.S. Cl. ................................................. 345/7; 345/74
[58] Field of Search .................................. 345/7, 8, 9, 74, 345/75, 76; 348/196, 201–205; 313/351, 352; 315/169.1, 169.3

[56] References Cited

U.S. PATENT DOCUMENTS

| | | | |
|---|---|---|---|
| 3,665,241 | 5/1972 | Spindt et al. | 313/351 |
| 3,753,022 | 8/1973 | Fraser, Jr. | 313/78 |
| 3,921,022 | 11/1975 | Levine | 313/309 |
| 3,935,500 | 1/1976 | Oess et al. | 313/495 |
| 3,970,887 | 7/1976 | Smith et al. | 313/309 |
| 3,982,147 | 9/1976 | Redman | 313/309 |
| 3,998,678 | 12/1976 | Fukase et al. | 156/3 |
| 4,008,412 | 2/1977 | Yuito et al. | 313/309 |
| 4,095,133 | 6/1978 | Hoeberechts | 313/336 |
| 4,227,883 | 10/1980 | Kaplan | 29/571 |
| 4,256,532 | 3/1981 | Magdo et al. | 156/628 |
| 4,307,507 | 12/1981 | Gray et al. | 29/580 |
| 4,325,000 | 4/1982 | Wolfe et al. | 313/336 |
| 4,337,115 | 6/1982 | Ikeda et al. | 156/659.1 |
| 4,498,952 | 2/1985 | Christensen | 156/643 |
| 4,513,308 | 4/1985 | Greene et al. | 357/55 |
| 4,531,122 | 7/1985 | Redfield | 340/781 |
| 4,578,614 | 3/1986 | Gray et al. | 313/309 |
| 4,614,564 | 9/1986 | Sheldon et al. | 156/657 |
| 4,670,090 | 6/1987 | Sheng et al. | 156/653 |
| 4,683,024 | 7/1987 | Miller et al. | 156/643 |
| 4,685,996 | 8/1987 | Busta et al. | 156/628 |
| 4,724,328 | 2/1988 | Lischke | 250/492.2 |
| 4,774,433 | 9/1988 | Ikebe et al. | 313/362.1 |
| 4,824,795 | 4/1989 | Blanchard | 437/62 |
| 4,853,545 | 8/1989 | Rose | 250/396 R |
| 4,869,575 | 9/1989 | Kubik | 345/8 |
| 4,934,773 | 6/1990 | Becker | 345/8 |
| 4,964,946 | 10/1990 | Gray et al. | 156/643 |

(List continued on next page.)

FOREIGN PATENT DOCUMENTS

| | | | |
|---|---|---|---|
| 58-94741 | 6/1983 | Japan | H01J 27/02 |

OTHER PUBLICATIONS

Warren, J. B., "Control of Silicon Field Emitter Shape with Isotropically Etched Oxide Masks", Inst. Phys. Conf. Ser. No. 99, Section 2, pp. 37–40.

*Primary Examiner*—Xiao Wu
*Attorney, Agent, or Firm*—Collier, Shannon, Rill & Scott, PLLC

[57] ABSTRACT

An imaging apparatus for providing an image from a display to an observer, comprising: a display generating an optical output, an imaging surface member constructed and arranged for viewing by said observer, and a scanning mirror/lens assembly optically interposed between the display and the imaging surface member, and constructed and arranged to motively repetitively scan the display, generate a scanned image, and transmit the scanned image to the imaging surface member, for viewing of the scanned image. Various field emitter display designs and subassemblies are described, which may be usefully employed in such imaging apparatus.

8 Claims, 12 Drawing Sheets

U.S. PATENT DOCUMENTS

| | | | |
|---|---|---|---|
| 4,990,766 | 2/1991 | Simms et al. | 250/213 |
| 5,030,895 | 7/1991 | Gray | 315/350 |
| 5,053,673 | 10/1991 | Tomii et al. | 313/308 |
| 5,075,595 | 12/1991 | Kane . | |
| 5,129,850 | 7/1992 | Kane et al. | 445/24 |
| 5,141,459 | 8/1992 | Zimmerman | 445/24 |
| 5,141,460 | 8/1992 | Jaskie et al. | 445/24 |
| 5,188,977 | 2/1993 | Stengl et al. | 437/89 |
| 5,191,217 | 3/1993 | Kane et al. | 250/423 |
| 5,204,666 | 4/1993 | Aoki et al. | 345/9 |
| 5,227,769 | 7/1993 | Leksell et al. | 345/8 |
| 5,294,940 | 3/1994 | Wennagel et al. | 345/31 |
| 5,309,169 | 5/1994 | Lippert | 345/8 |
| 5,313,137 | 5/1994 | Wittey | 348/196 |
| 5,334,991 | 8/1994 | Wells et al. | 348/8 |
| 5,424,605 | 6/1995 | Lovoi . | |
| 5,457,356 | 10/1995 | Parodos | 345/80 |
| 5,541,473 | 7/1996 | Duboc, Jr. et al. . | |
| 5,686,790 | 11/1997 | Curtin et al. . | |

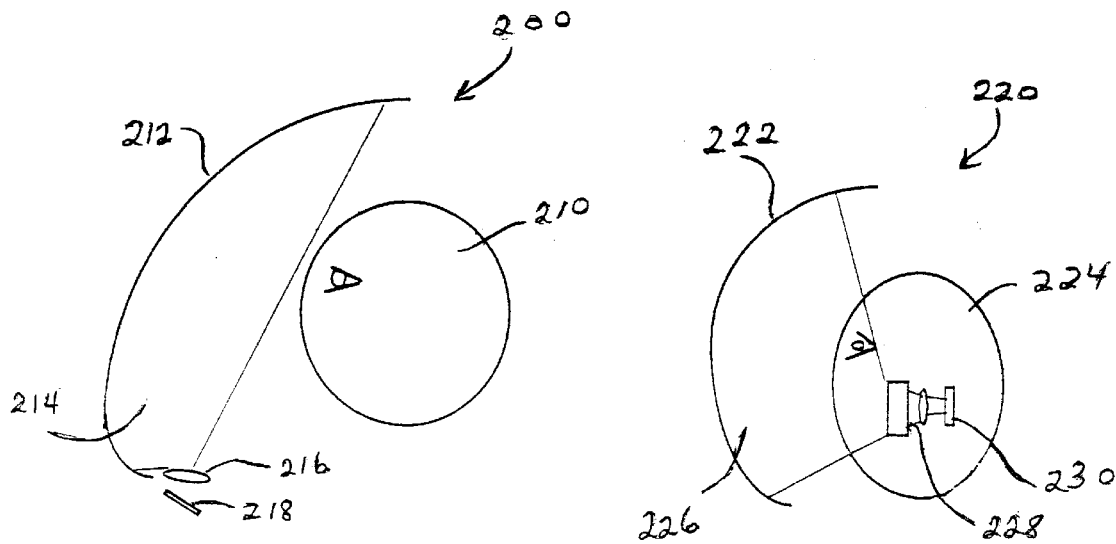
FIGURE 2A
FIGURE 2B
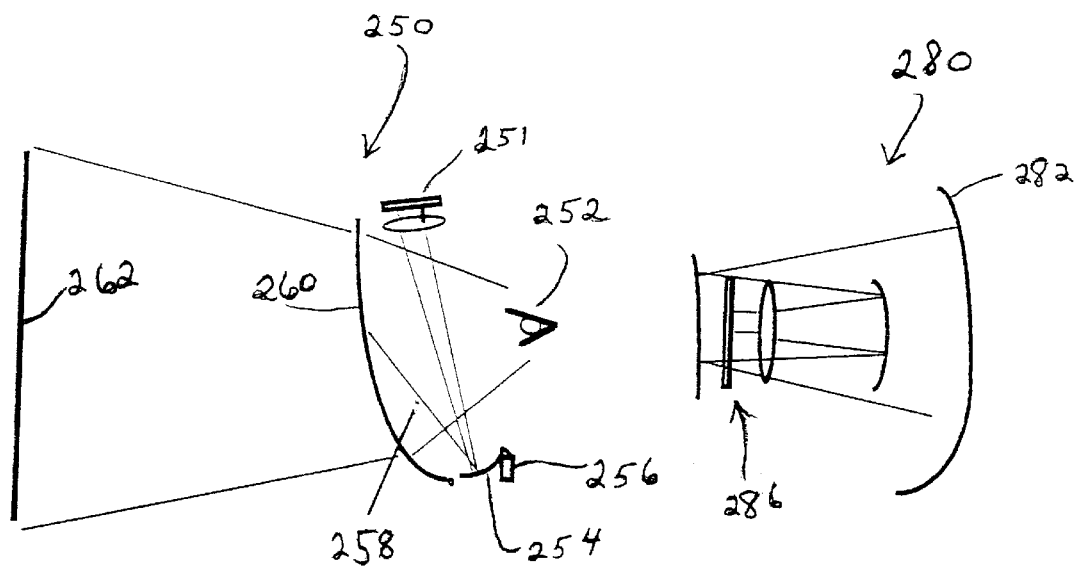
FIGURE 2C
FIGURE 2D

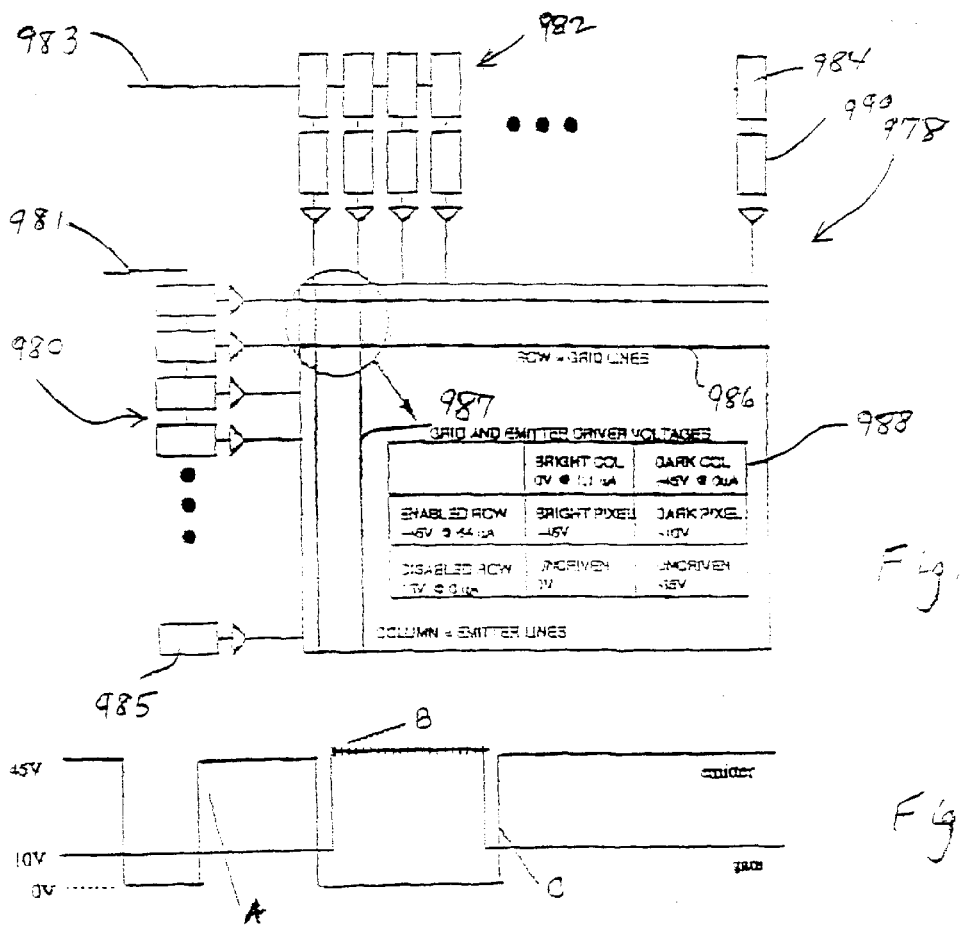

COMPACT, BODY-MOUNTABLE FIELD EMISSION DISPLAY DEVICE, AND DISPLAY PANEL HAVING UTILITY FOR USE THEREWITH

This application is a continuation of U.S. patent application Ser. No. 08/290,238, filed on Aug. 15, 1994, now abandoned, which is a continuation-in-part of U.S. patent application Ser. No. 08/029,880 filed on Mar. 11, 1993, now abandoned.

BACKGROUND OF THE INVENTION

1. Field of the Invention

This invention relates to dimensionally compact (narrow) body-mountable field emission display devices, as for example, head-mountable display systems, which incorporate row projection scanning to provide a full field of view. Such displays can be fabricated in very small size, and at low cost. The field emission display devices of the invention may be suitably embodied in flat-panel displays using cathodoluminescent phosphors.

2. Description of the Related Art

In the technology of field emission structures and devices, a microelectronic emission element, or a plurality (array) of such elements, is employed to emit a flux of electrons from the surface of the emission element(s). The emitter surface ("tip") is specifically shaped to facilitate effective emission of electrons, and emitted electron beams are directed, e.g., with the assistance of focusing electrodes or other directionally orienting structures, to an anode, which may comprise a plate member bearing an array of phosphors or other electroluminescent elements, to provide a selected visual output.

Field emission display devices may be fabricated in a wide variety of shapes and sizes, and much effort has been directed in recent years to the development of field emission-based flat panel displays, for computer, graphic, and telecommunications applications.

Tomii et al. U.S. Pat. No. 5,053,673 teaches the formation of vertical field emission structures by forming elongate parallel layers of cathode material on a substrate, followed by attachment of a second substrate so that the cathode material layers are sandwiched therebetween in a block matrix. Alternatively, the cathode material layer can be encased in a layer of electrically insulative material sandwiched in such type of block matrix. The block then is sectioned to form elements having exposed cathode material on at least one face thereof. In the embodiment wherein the cathode material is encased in an insulative material, the sliced members may be processed so that the cathode material protrudes above the insulator casing. The exposed cathode material in either embodiment then is shaped into emitter tips (microtip cathodes).

Spindt et al. U.S. Pat. No. 3,665,241 describes vertical field emission cathode/field ionizer structures in which "needle-like" elements such as conical or pyramidal tips are formed on a (typically conductive or semiconductive) substrate. Above this tip array, a foraminous electrode member, such as a screen or mesh, is arranged with its openings vertically aligned with associated tip elements. In one embodiment disclosed in the patent, the needle-like elements comprise a cylindrical lower pedestal section and an upper conical extremity, wherein the pedestal section has a higher resistivity than either the foraminous electrode or the upper conical extremity, and an insulator may be arranged between the conical tip electrodes and the foraminous electrode member. The structures of this patent may be formed by metal deposition through a foraminous member (which may be left in place as a counter-electrode, or replaced with another foraminous member) to yield a regular array of metal points.

Copending U.S. application Ser. No. 08/029,880 filed Mar. 11, 1993 in the name of Gary W. Jones discloses a vertical field emitter structure and field emission device such as a flat panel display utilizing such structure. Self-aligned gate and emitter fabrication is described, together with virtual column field emitter structures, comprising an emitter or gated emitter with conductive columns connecting the emitter to an underlying resistor or conductor structure formed by chemical or other modification of portions of an underlying layer. The display disclosed in this copending application utilizes field emission structures with low turn-voltages and high accelerating voltages, thereby permitting high brightness, small pixel size, low manufacturing costs, uniform brightness, and high energy efficiency to be achieved.

In field emitter technology, as exemplified by the structures and devices described in the above-discussed patents, there is a continuing search for improvements, particularly under the impetus of commercial as well as military interest in the development of practical and reliable flat panel display devices. The art has recognized the need for continuing reductions in size and volume of field emission displays.

Further, there is a need for very small size field emission display devices, such as may be mounted on the body for ready viewing. One desirable body-mountable application is head-mounted devices, which can for example be fabricated into helmets or other headgear, or alternatively constructed as viewing goggles or eyewear.

It would therefore be a substantial advantage in the art, and is an object of the present invention, to provide a field emission display device, which is compact in size, simply, quickly, and economically fabricatable, using conventional fabrication equipment and thin film processing techniques.

It is another object of the present invention to provide a field emission display device of such character, which is body-mountable in nature.

It is yet another object of the present invention to provide a field emission display device of such type, which is head-mountable in character.

Other objects and advantages of the invention will be more fully apparent from the ensuing disclosure and appended claims.

SUMMARY OF THE INVENTION

In one aspect, the present invention relates to a display device comprising a scanned display.

The scanned display device of the invention suitably includes one or more of the following subassemblies:

1. A linear display consisting of a single line of pixels, a line of red, green, and blue pixels, or several lines of pixels consisting of less than a full 2-D image. While a field emitter display is anticipated as the optimum light source, LCD, electroluminescent, CRT, and plasma displays are also possible display information light sources.
2. A mirror and/or lens system consisting of a narrow mirror and a motion transducer. Either the mirror or the display may be shifted or rotated to provide the desired motion. The desired motion consists of a scanning of the linear or partial 2-D image across the image plane. This system is synchronized with the display data to create an entire image.

3. A projection surface. This may be incorporated in or otherwise embody or comprise goggles, glasses, helmets, domes, or other projection surface structures visible to the observer.

A ultra-small, lightweight, and potentially low cost head-mountable display is more fully described hereinafter as a specific embodiment of this invention.

In a preferred display aspect, a field emitter display is employed using cathodoluminescent phosphors which are excited by electrons in a display panel comprising a phosphor plate member in spaced relation to an electron-emitter plate member, in which the respective plate members are components of a display panel housing comprising an interior volume between the plate members. The interior volume of the display panel housing is maintained at suitable low pressure (vacuum) conditions, e.g., by means of chemisorbents, such as getter materials which are selectively sorptive of inleaking atmospheric gases as well as off-gas species generated in situ from the components of the display panel.

In such displays, both the energy of the emitted electrons as well as the current hitting the phosphor (or other electroluminescent elements) can be selectively controlled. In contrast to cathode ray tubes (CRTs), whose major deficiencies are attributable to the use of a single electron beam for striking a phosphor, the field emitter device (FED) utilizes an anode structure in which each electroluminescent pixel is excited by its own microminiature electron gun which is microfabricated on a (flat) substrate using well-developed microelectronics processing methods. This array of microminiature array of electron guns is termed a field emitter array (FEA), and the electron emission process is field emission, a cold tunneling process which does not require heating as in thermionic cathodes used in CRTs.

Since the FEA cell is of micron dimensions, clusters of these cells can exite a single pixel, thereby providing redundancy, uniformity and stability. The FEA also has a highly non-linear current-voltage characteristic so that row-column addressibility is usefully employed rather than pixel addressibility. FEAs can also operate in relatively poor vacuum conditions in unbaked chambers, a marked advantage over CRTs. Accordingly, FEAs are preferred emitter structures, and FEDs are preferred display devices in the scanned display aspects of the present invention.

In another aspect, the present invention relates to a multichip module field emitter display, including a row and column driver assembly, and an address control system, as hereinafter described.

A further aspect of the invention relates to display panel devices comprising direct interconnection structure for interconnecting the display and driver electronics, without a transition wire bond or other unreliable connection means. In a specific embodiment, connection may be made in the panel by metal to metal deposition directly to the vias of a ceramic carrier, involving the passage of large high reliability vias through the substrate and connection to high density lines by small vias without shorting neighboring lines.

Yet another aspect of the invention relates to processing of an integrated substrate comprising a co-fired ceramic providing via connections to which field emitter array interconnects are metallized. The ceramic is polished flat and smooth, and a silicon dioxide coating is sputtered on the substrate, following which the substrate is repolished. The substrate next is patterned and etched to open the vias. The vias will be gradually sloped or filled with metal prior to deposition of the emitter line metal. Openings are cut to permit gate lines to be connected after emitter and insulator processing. The backside of the ceramic is provided with bond pads thereon to accept the display driver devices in bare die form. A connector is provided for interface to a suitable driver source, e.g., a PC video driver.

Other aspects and features of the invention will be more fully apparent from the ensuing disclosure and appended claims.

DETAILED DESCRIPTION OF THE INVENTION, AND PREFERRED EMBODIMENTS THEREOF

Figure 1:
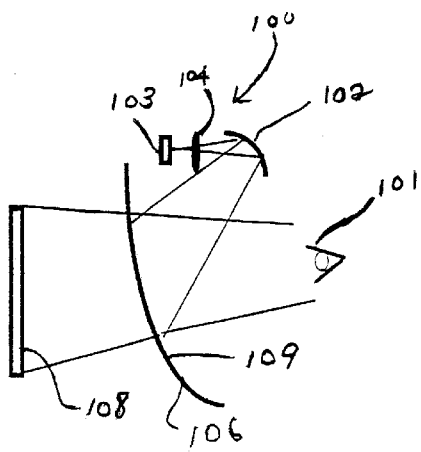
FIG. 1 is a schematic representation of a head-mountable display device according to one aspect of the present invention.

Referring now to the drawings, FIG. 1 shows a schematic representation of some of the primary components of a head-mountable display device 100 according to one embodiment of the present invention.

The display device 100 shown in FIG. 1 is shown in reference to the eye of an observer 101 and the image source or object 103. The display device 100 comprises the display 106 having imaging surface 109 defining a scanned region of the display, a scanning mirror/lens subassembly 102, and optional optics 104, with a virtual image 108 being produced beyond the imaging surface 109.

In this device, the display 106 or the mirrors/lens subassembly 102 may be scanned. Focusing may occur using either the shape of the mirror, the shape of the display 106, or additional optics 104. The virtual image 108 is meant to appear at infinity focus. The virtual image may appear at a wide range of virtual sizes, positions, foci, or distances, depending on the optics configuration employed.

The optional optics 104 and/or the position of the optics elements may also be used for focusing and positioning of the image for various users.

Pairs of these displays may be used to create stereo vision, or additional optics may be used to switch alternative images to the left and right eyes of the observer.

Optional sequential left and right scanning may also be used to stitch fields together and create larger effective lateral images using shorter display arrays. Such expedient can further reduce the cost of the display array component by reducing the number of driver circuits and shrinking the array sizes.

Figure 1A:
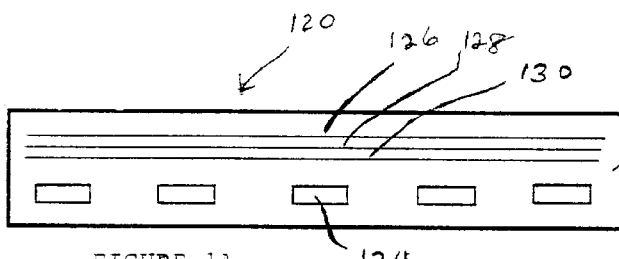
FIG. 1A is a front elevational view of a display chip layout for a display of the type schematically shown in FIG. 1.
Figure 1C:
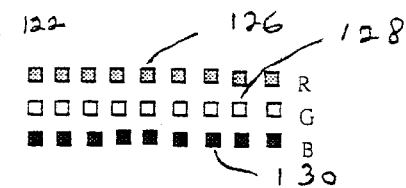
FIG. 1C is an enlarged view of the layout of the RGB pixel rows of the display chip layout of FIG. 1A.

FIG. 1A is a front elevational view of a display chip layout for display of the type schematically shown in FIG. 1. Such display chip layout 120 comprises a plate or substrate member 122 on which is disposed a series of driver integrated circuits 124 and associated rows 126, 128, and 130 of red/green/blue (RGB) pixel elements. An enlarged view of the layout of the RGB pixel rows 126 (R), 128 (G), and 130 (B) is shown in FIG. 1C, as comprising the discrete pixel elements in each row.

Figure 1B:
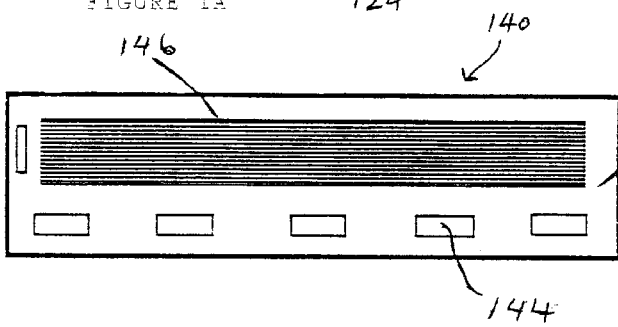
FIG. 1B is a front elevational view of another display chip layout for a display of the type schematically shown in FIG. 1, comprising an array including 256 rows of pixels.

FIG. 1B is a front elevational view of another display chip layout 140 for display of the type schematically shown in FIG. 1, comprising an array 146 including 256 rows of pixels. Such display chip layout 140 comprises a plate or substrate member 142 on which is disposed a series of driver integrated circuits 144 and the array 146 of red/green/blue (RGB) pixel elements. An enlarged view of the layout of the RGB pixel rows array 146 is shown in FIG. 1D, as comprising the discrete pixel elements in each row.

Figure 1D:
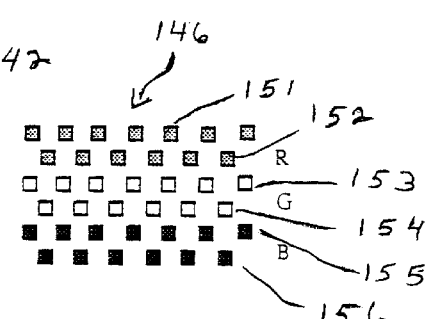
FIG. 1D is an enlarged view of the layout of the RGB pixel rows array of the display chip layout of FIG. 1B.

In the embodiment shown in FIG. 1B, each pixel row has been expanded into pairs of pixels as shown in FIG. 1D, so that the array 146 of pixel element rows includes rows 151 and 152 of red pixel elements, rows 153 and 154 of green pixel elements, and rows 155 and 156 of blue pixel elements. If optically or temporally (by scan speed and data input) superimposed, high density pixel arrays may be produced without requiring high density pixels on the display source (s).

In these embodiments, the display array is step scanned across the image plane. Rows of different colors may be overlaid using either (1) the optics, or (2) timing scan rate and data rates to superimpose the color pixels. In the chip layout shown in FIG. 1B, using a 'partial 2-D display', pixels rows may be scanned on the partial display array, and then the mirror or optics system may step the partial display to effectively create a "whole" virtual image. This permits slower decay phosphors to be used than the single or three color arrays.

More than three colors may be accomodated in display devices according to the invention, and infrared (IR) and ultraviolet (UV) imaging are also contemplated within the broad scope of the present invention.

In the use of the display devices according to the present invention, the optics or the mirror may be simultaneously oscillated back and forth to provide stereo imaging from a single display source.

The present invention is applicable to large and small area displays, however, in a highly advantageous embodiment of the invention, the display device suitably comprises, and is configured as, a body-mountable display device, for mounting and operation on the human body, preferably as a head-mounted display. In the ensuing disclosure, a preferred form of the invention will be described, in the form of an ultra-small, lightweight, and low-cost head mounted display (HMD) unit.

Many scanning-based video displays have been developed in the past. In such systems, spots usually are scanned across a surface and integrated by the eye or a phosphor to generate a two-dimensional (2-D) array.

The invention is unique in that it scans a linear image across the field of view. As a result of such scanning capability, the present invention permits a number of operating advantages and features to be realized, including:

1. scanning of a linear image array onto an image plane;
2. scanning of a partial 2-D linear image array onto an image plane;
3. scanning onto a asymmetric image plane at a shallow angle using asymmetric lenses and/or mirrors;
4. use of piezoelectric transducers to scan the image;
5. use of micro mechanical mirrors to scan the image (the prior art has used micro mechanical mirrors to produce on-off reflections with a scanned input beam which projected a 2-D image, whereas the scanning mirror arrangement of the present inventionis advantageously arranged to step scan the image from a linear or partial 2-D pixel source);
6. mounting of an image source and display system onto the human body, e.g, in the form of a head-mounted display system;
7. use of a field emitter display as an imaging source; and
8. the capability to project the information on a transparent screen and overlay the projected information.

Figures 2A, 2B:
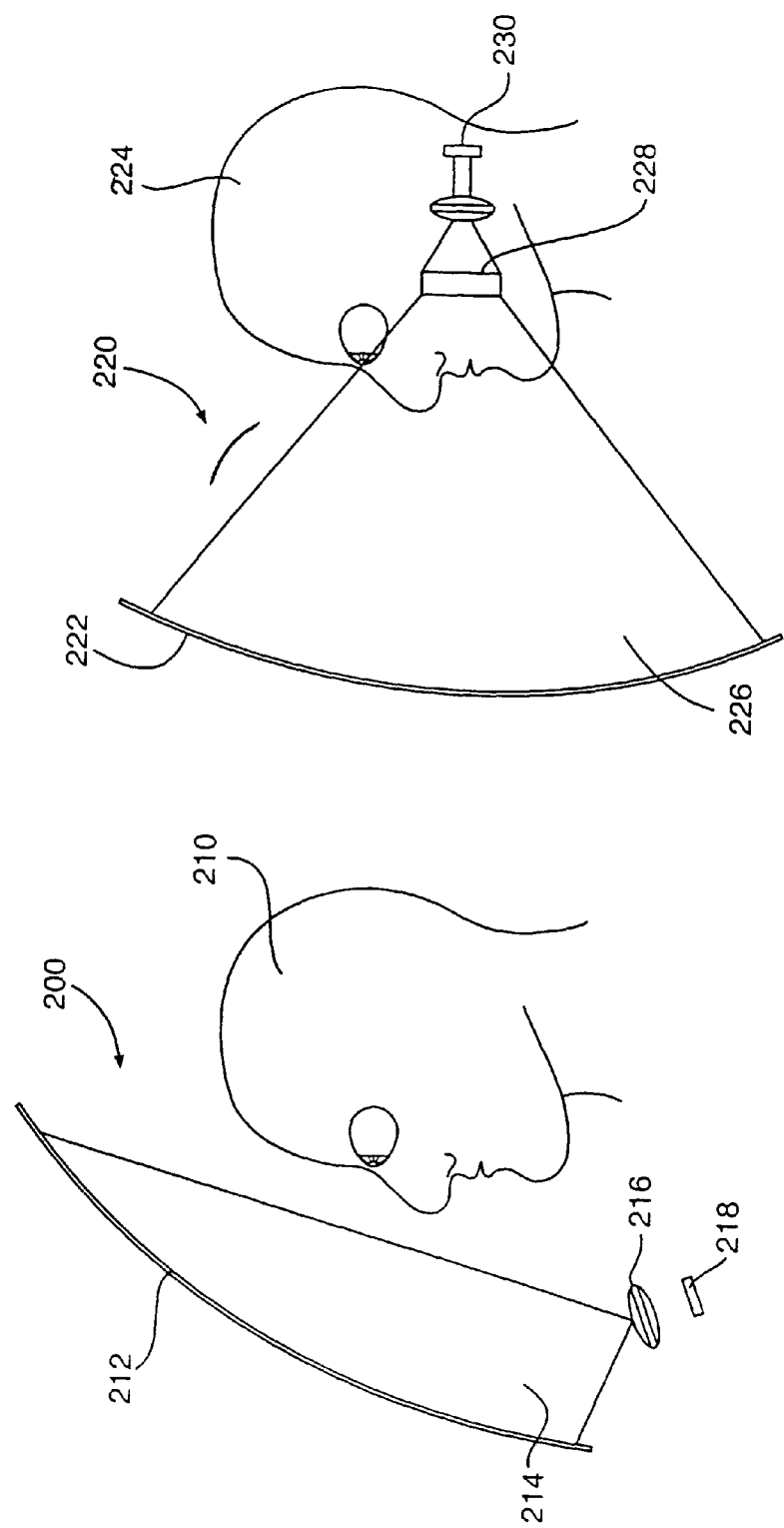
FIGS. 2A, 2B, and 2C show schematic representations of several head-mounted display system embodiments according to the present invention.
Figure 2D:
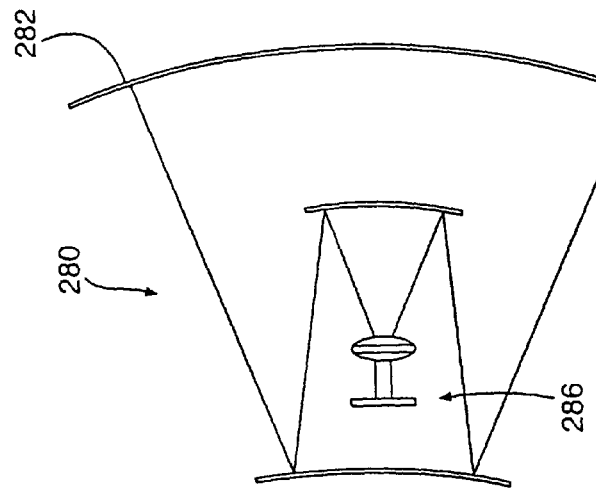
FIG. 2D is a schematic representation of a display system according to another embodiment of the invention, utilizing back reflective optics.
Figure 2C:
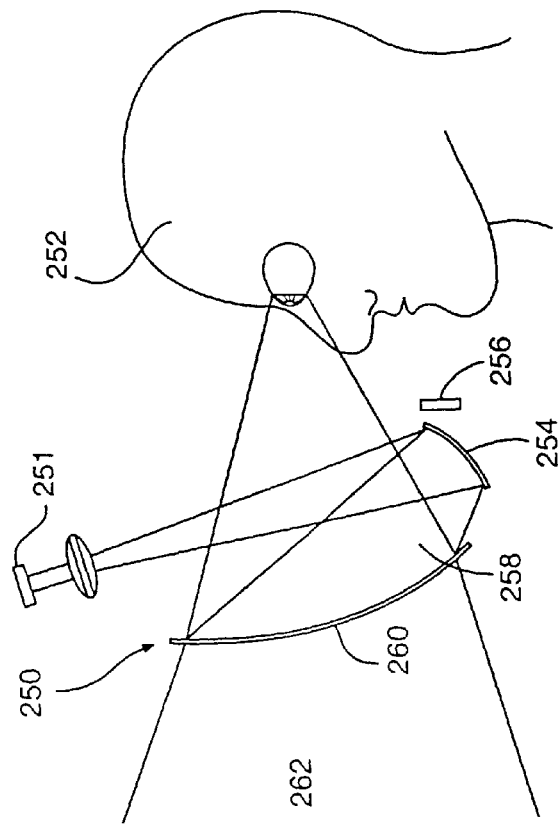
Figure 3A:
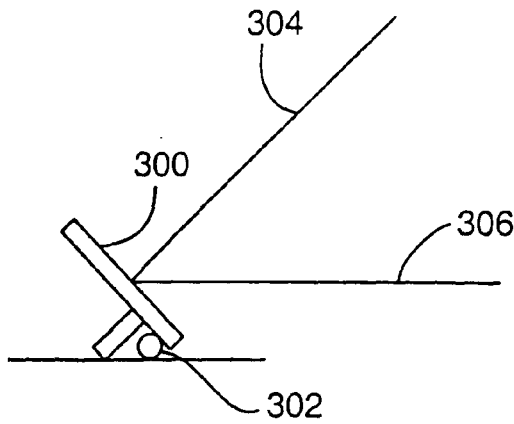
Figure 3B:
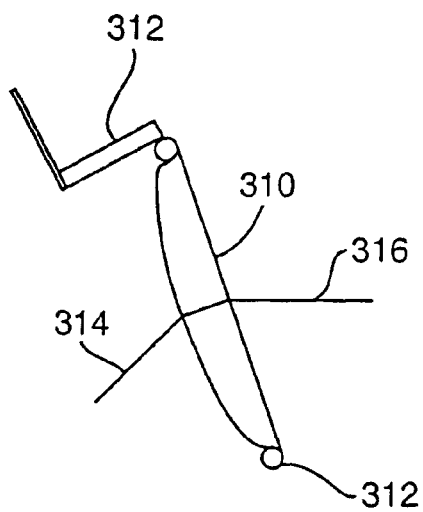
Figure 3C:
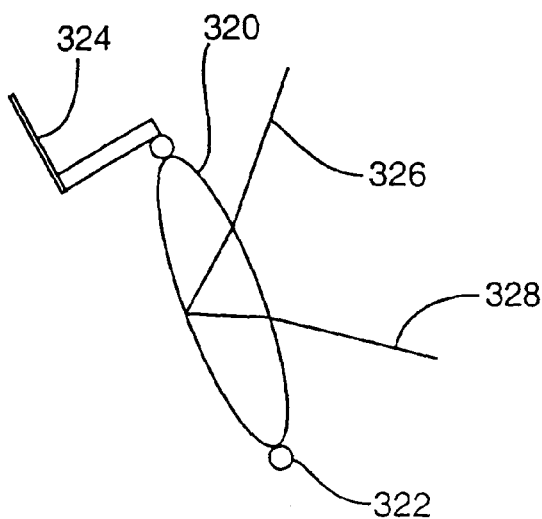
Figure 4A:
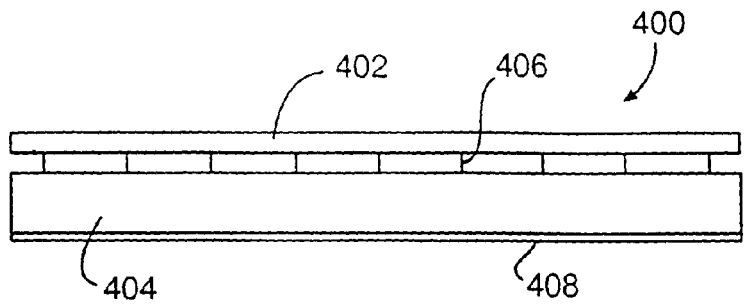
Figure 4B:
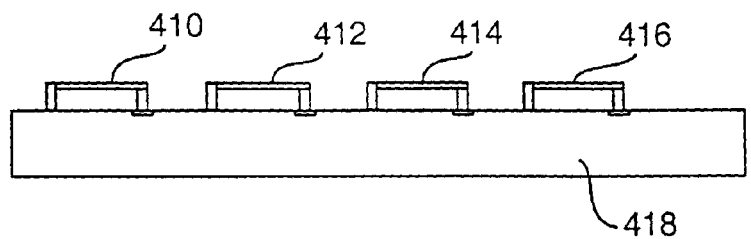
Figure 4C:
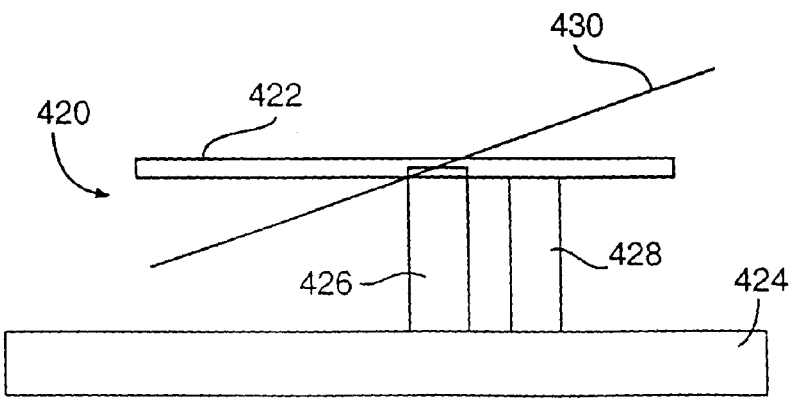
Figure 4D:
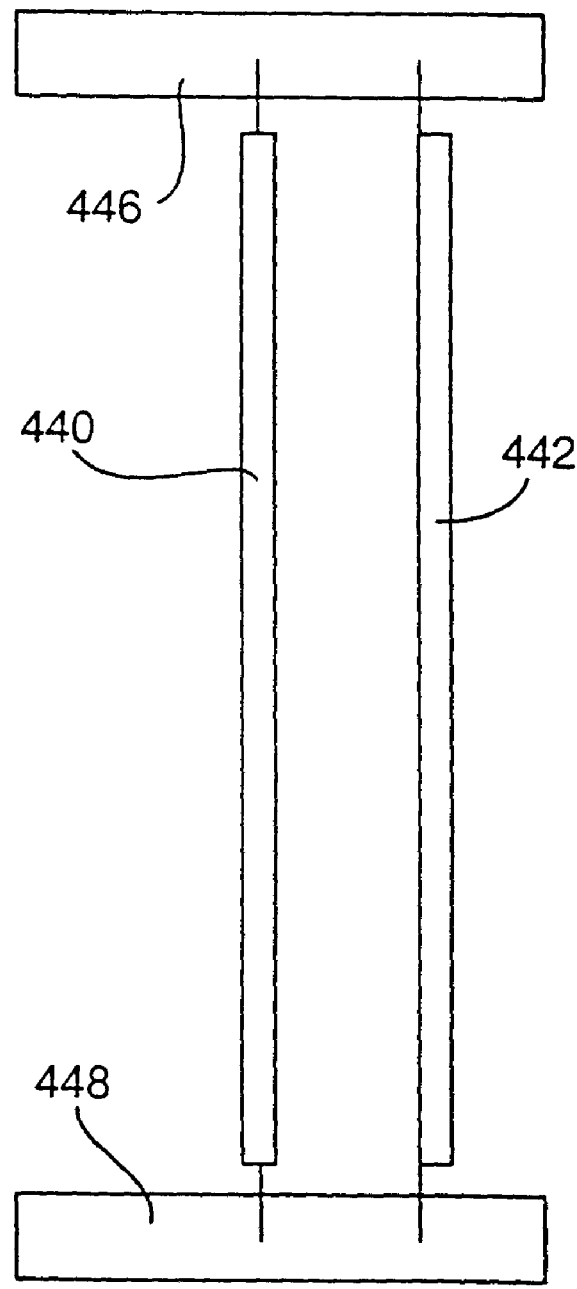
Figure 5A:
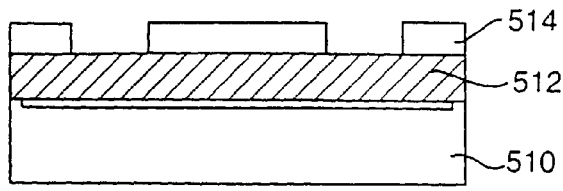
Figure 5B:
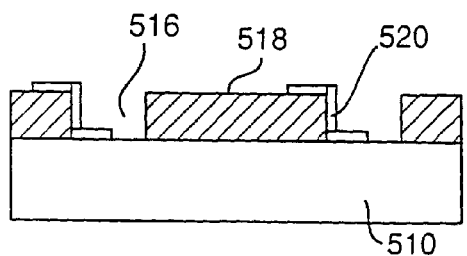
Figure 5C:
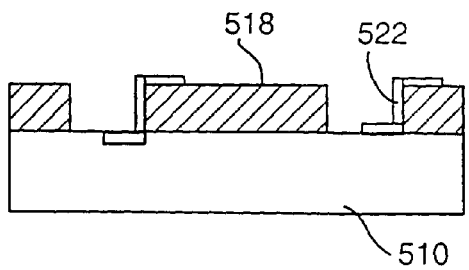
Figure 5D:
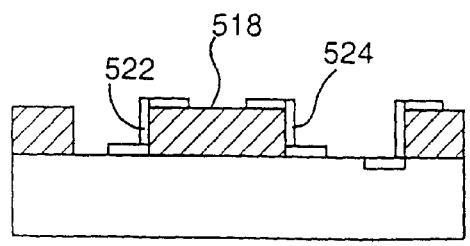
Figure 6A:
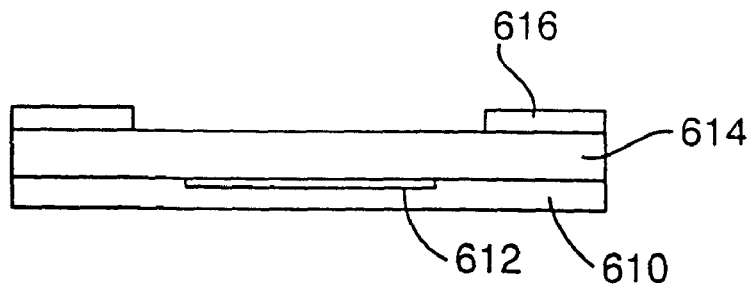
Figure 6B:
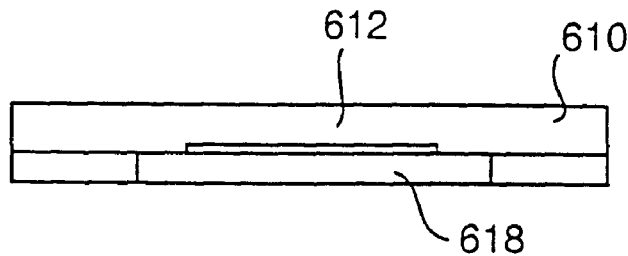
Figure 6C:
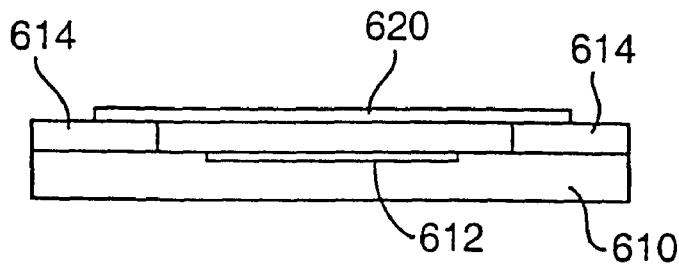
Figure 7A:
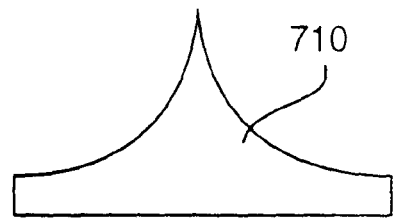
Figure 7B:
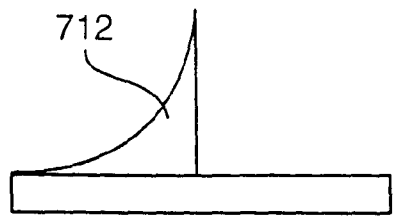
Figure 7C:
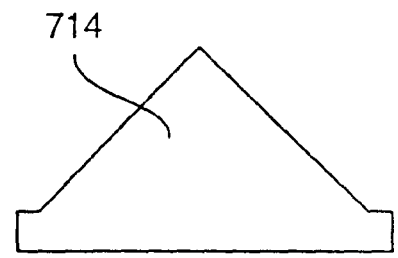
Figure 7D:
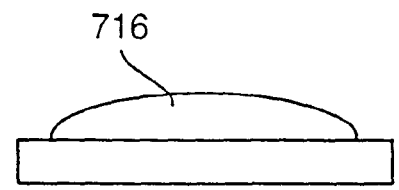
Figure 7E:
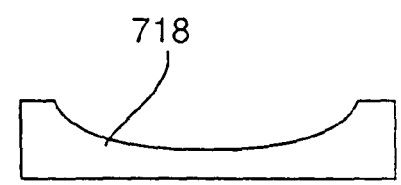
Figure 7F:
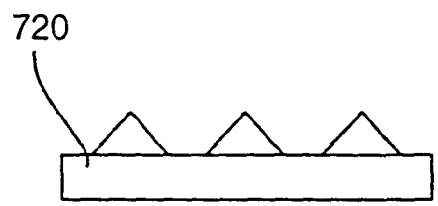
Figure 7G:
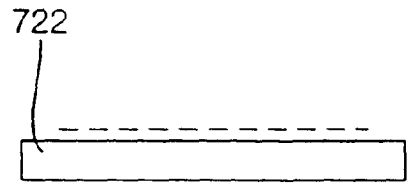
Figure 7H:
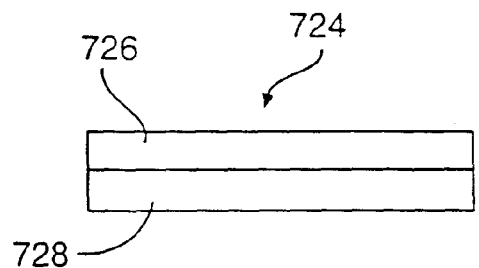
Figure 7I:
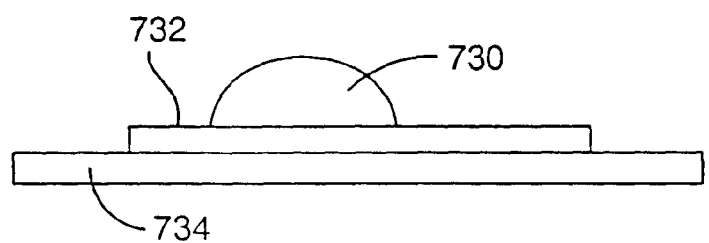
Figure 8:
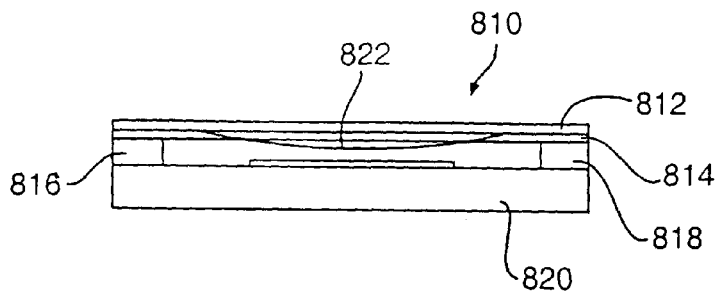
Figure 9A:
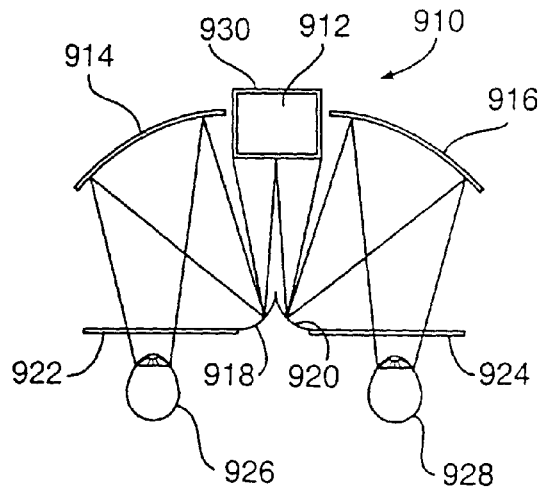
Figure 9B:
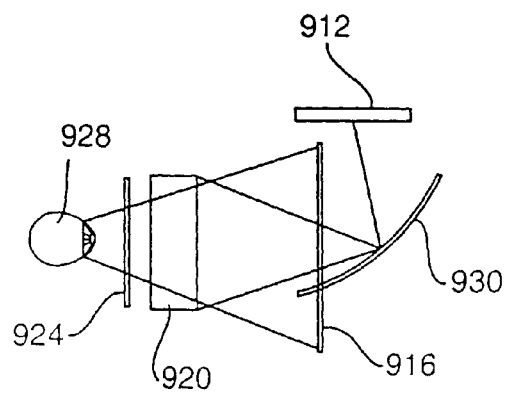
Figure 9C:
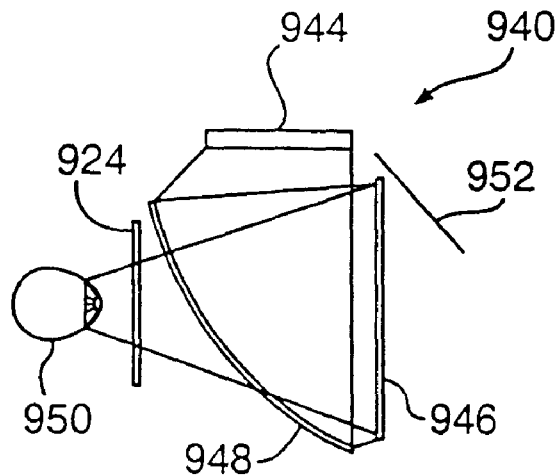
Figure 10:
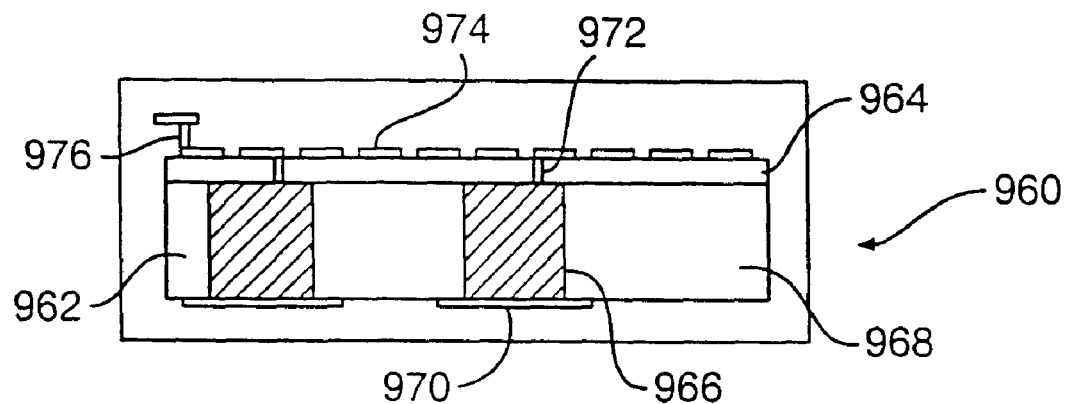

Schematic representations of several head-mounted display system embodiments are shown in FIGS. 2A, 2B, and 2C.

FIG. 2A shows a schematic representation of a display system 200 according to one embodiment of the present invention, in relation to the observer 210. The display system comprises a scan dome 212 defining a scan area 214, a scanned lens 216 and a display 218. This system comprises a dome type optics arrangement, with projection from below. In this embodiment, multiple displays may be used to build 360 degree view. The display dome may be inverted with optics above, below, or at sides.

FIG. 2B shows a schematic representation of a side projection helmet display system 220 according to another embodiment of the invention, in relation to a user 224. In this embodiment, the scan surface 222 defines a scan area 226, and the side projection display 230 is associated with optics 228.

FIG. 2C shows a schematic representation of a projection optics display system 250 according to a further embodiment of the invention, in relation to an observer 252. In this system, which uses a separated scanner and display arrangement, a display and focus optics subassembly 251 coacts with a mirror-optics position control and transducer subassembly, comprising mirror 254 and transducer 256, in relation to imaging screen 260 (a scan line 258 is shown between the mirror 254 and the imaging screen 260) and the resulting virtual image 262. In the FIG. 2C embodiment, the image from a red, green, and blue linear array is superimposed and focused onto a rotatable reflector. The reflector is rotated step by step to scan the full field of imaging screen.

FIG. 2D is a schematic representation of a back reflective optics display system 280 according to yet another embodiment of the invention. In this embodiment, the imaging screen 282 is shown in spaced relation to the display-mirrors-lens subassembly 286.

FIG. 2D demonstrates back reflective optics which permit a longer optical distance, and less aggressive lens design for infinity focus by increasing the optical path length in a small space. The red green and blue spots are superimposed to form full color pixels. Alternating array pairs of red, green, and blue pixels may be used prior to being superimposed to ease the display design, and yet produce a high density pixel array.

Flat screen projection embodiments of the invention are also contemplated, although curved asymmetric optics may be most suitable in the majority of head mounted display applications. Top down and bottom up projection are both contemplated in the broad practice of the present invention.

If top-down or bottom-up optics are used, the display must be placed far enough away from the head to permit optical clearance of the nose, or the optical path must be on one side of the face or the other. The use of pairs of displays, one on each side of the face not only permits stereo vision, but also permits optimal focusing for each eye, in the case of observers with differing vision in each eye.

In the mechanical scan system preferably utilized in display devices of the present invention, the linear image from the display is step scanned one row, or group of rows, at a time to create the 2-D image to the viewer. The sequence is repeated for every new frame of information.

Depending upon the head mounted configuration chosen, asymmetry along the length of the mirror or lens is required to allow the shallow angle incident light to reflect off the projection screen or dome and to the observer as a clear focused image. Focusing and adjustment of the display size and position is performed by changing the distance between the optical elements, and with an added lens.

Figure 3A:
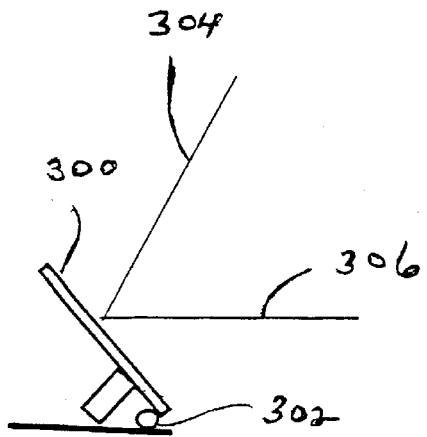
FIG. 3A is a schematic representation of a reflective scanner design according to one embodiment of the invention.

FIG. 3A shows a reflective scanner design, in which the incident light beam 304 impinges on mirror 300 (mounted on pivot mechanism 302) and reflected as reflected light beam 306. Although the mirror is shown in FIG. 3A as being linear in character, it will be understood that the mirror may alternatively be curvate, being curved assymmetrically across its surface.

Figure 3B:
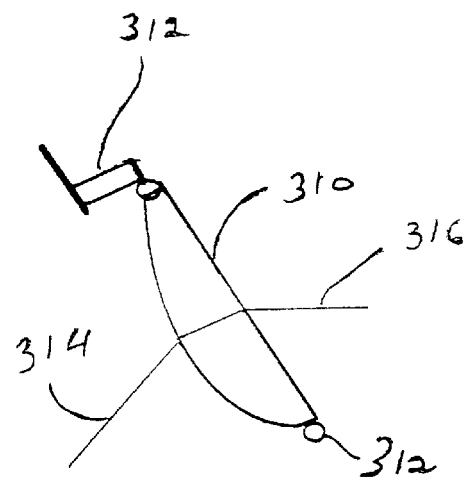
FIG. 3B is a schematic representation of a refractive scanner design, according to another embodiment of the invention.

FIG. 3B shows a refractive scanner design, in which a lens 310 mounted on pivot mechanism 312 and operatively coupled with transducer 312 receives incident light beam 314 and produces output (refracted) light beam 316.

Figure 3C:
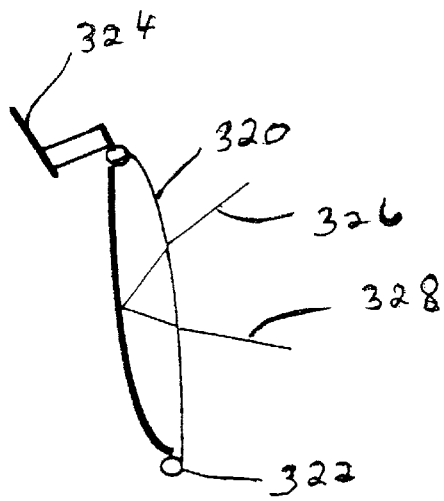
FIG. 3C shows a combined mirror and lens optics design, according to one embodiment of the present invention.

FIG. 3C shows a combined mirror and lens optics design, in which the lens 320 mounted on pivot structure 322 and operatively associated with transducer 324 receives incident light beam 326 and produces output light beam 328.

The asymmetry in the direction of the scan may be modified by non-linearly changing the speed of the scan, the shape of the mirror, the shape of the lens, the shape of the projection screen, or by adding other optics. Combined mirrors and optics are illustratively shown in FIG. 3C. Asymmetry along the length of the lens or mirror must be achieved by modifying the optics and cannot practically be changed with scan, although stepped scans may be used to stitch wide fields together. In some instances, it may be advantageous to correct asymmetry by using the visor or dome optics, thereby simplifying the scanner design.

In accordance with the foregoing, multiple optical elements may be used. The provision of multiple optical elements can improve image quality and simplify lens and mirror construction more. Coated glass and/or plastic optics may also be employed in the broad practice of the invention.

In addition, the display may be fabricated so that the imaging surface is partially transmissive or fully reflective of the scanned image transmitted thereto to provide the broadest practice of the invention. It will also be noted that the imaging surface may be arranged to visually exhibit a first infirmation from a source independent of the display. In this case, the mirror and lens assembly are constructed and arranged to project a second information from the display such that the first and second information are concurrently exhibited in superimposed relation to one another.

Concerning the use of transducer elements in the broad practice of the present invention, piezoelectric transducers are a preferred transducer choice because of their high speed, low cost, and their ability to be linearly or non-linearly controlled as required using corrected voltage or current forms. Position can be changed in steps in the course of the scanning operation to avoid skew of the image, although linear scanning may be acceptable for some applications or corrected by modifying the data fed into the display to compensate for the skew effects.

Electrostatic positioning and other mechanical assemblies are also contemplated in the broad practice of the present invention. Deformation of a mirror or lens is also contemplated as a scanning mechanism, but such scanning mode of operation generally is more difficult to implement than the corresponding non-deforming embodiments. Piezoelectric transducer stacks are available commercially to provide such scanning movement.

Micromechanical scanning mirror arrays may be fabricated in the broad practice of the present invention using multiple long reflective strips. An option for the mirror design is the use of micromechanical mirrors. Single or arrays of such mirrors can be used to scan the beam. If such approach is used, asymmetric optics may be employed, separate from the mirror. This approach may require additional optical elements, but the advantage is the provision of an integrated mirror/deflection assembly.

FIGS. 4A–D illustrates the fabrication steps involved in the construction of a micromechanical scanning array, using thin and/or thick film processing.

Figure 4A:
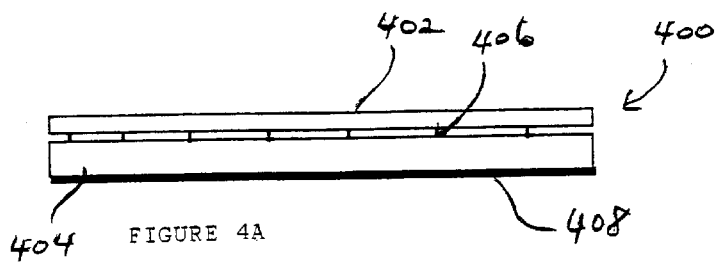
FIGS. 4A–D illustrates the fabrication steps involved in the construction of a micromechanical scanning array, using thin and/or thick film processing.

FIG. 4A is a plan view of a single mirror strip 400, comprising the metal strip 402, e.g., formed of aluminum or aluminum/chromium alloy, connected to the rigid post 404, constructed of silica or other suitable material, by means of the flex connections 406. The flex connections may for example be formed of aluminum or aluminum/chromium alloy. The rigid post may have a layer 408 of piezoelectric material (e.g., sol gel lead zirconium titanate material) thereon.

Movement is obtained by compressing the piezoelectric material. Large deflection angle can be obtained by moving the piezoelectric stand closer to the hinge of the mirror.

Figure 4B:
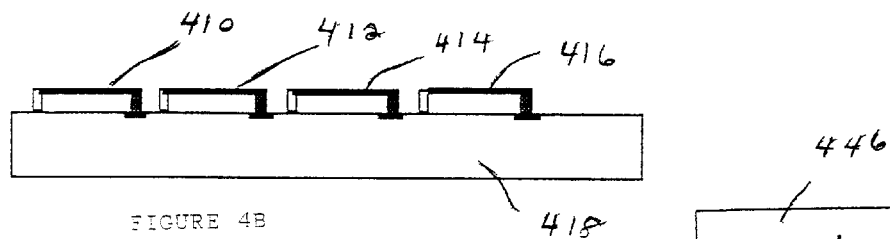

FIG. 4B shows a side cross-sectional view of an array of mirror strips 410, 412, 414, and 416 on a substrate 418. The substrate may suitably be formed of a glass or other appropriate material, and the metal strips may be constructed of aluminum/titanium material.

Figure 4C:
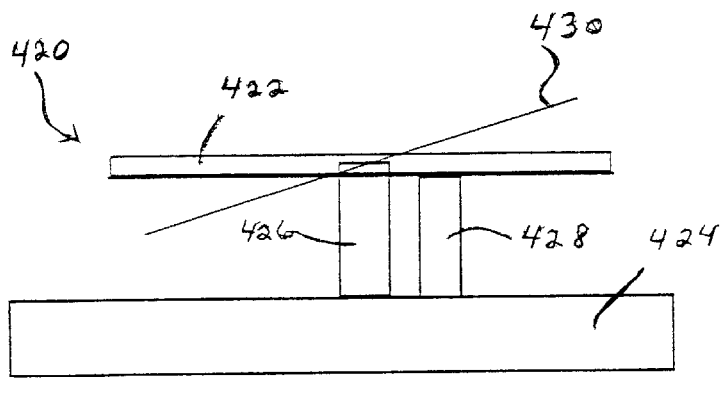

FIG. 4C shows a mirror tilt system 420 using center axis tilting, such as may suitably comprise a micromechanical mirror assembly, or other small-scale assembly. The tilt axis connection can be under or at the ends of the mirror 422. The mirror 422 is mounted on substrate 424 by means of stand 426, and the piezoelectric stand 428 provides tilting action to the mirror, as shown by the mirror tilt position 430 in FIG. 4C.

Figure 4D:
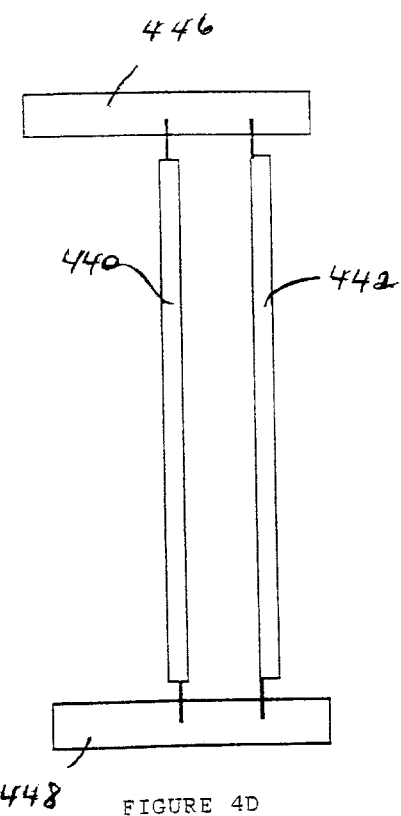

FIG. 4D shows top views of two longitudinal mirrors 440 and 442 mounted on substrate members 446 and 448, one mirror being flexed from one side (mirror 440), and the other mirror being flexed from the center (mirror 442). Either mirror can be built with piezoelectric stack actuators so as to be deflected using electric field force for deflection.

FIGS. 5A–D illustrate the successive steps in the fabrication of an integrated mirror/deflection assembly according to one embodiment of the invention.

Figure 5A:
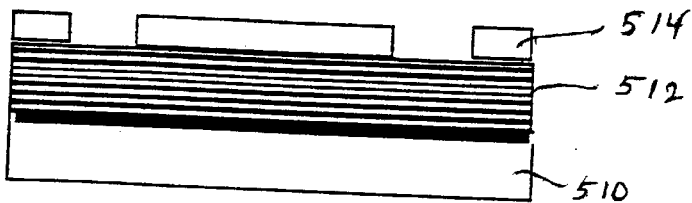
FIGS. 5A–D illustrate the successive steps in the fabrication of an integrated mirror/deflection assembly according to one embodiment of the invention.

FIG. 5A shows the formation on substrate 510 of alternating layers 512 of metal and piezoelectric by sol gel spin on, sputtering, or other PVD process, utilizing spin and pattern resist processing, with reversal of such sequence in the provision of a lift-off version of the process. Alternate metal layers are provided between two metals with dissimilar etch rates in an etchant selective to the piezoelectric material, e.g., aluminum, TiW, nickel, or platinum. The resist pattern 514 in such processing can be rings with open circles.

An optional liftoff layer and bottom metal (e.g., PMGI under platinum on titanium) may advantageously be employed.

Figure 5B:
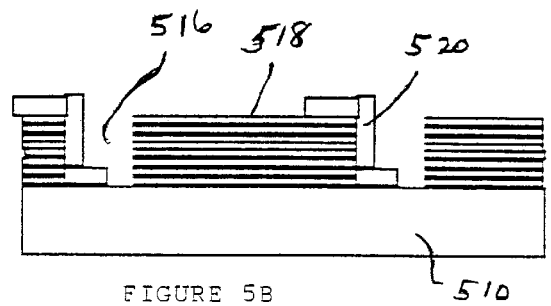

FIG. 5B shows the etch (or lift off) formation of cavities 516 surrounding pedestals 518 of piezoelectric material (e.g., PZT). One side of the pedestals is initially patterned with a resist 520, followed by etch back of one set of the alternating metal layers (e.g., etch back of aluminum by ~5 microns in phosphoric acid+nitric acid+acetic acid mix). Ultrasonic drilling may also be used to etch the stack without the resist mask.

Figure 5C:
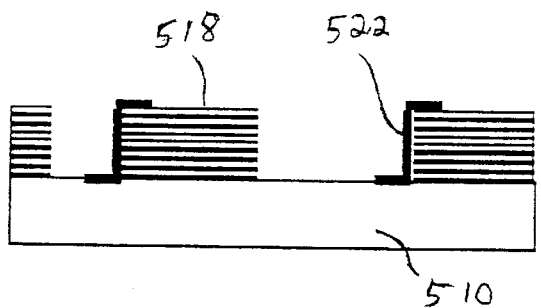
Figure 5D:
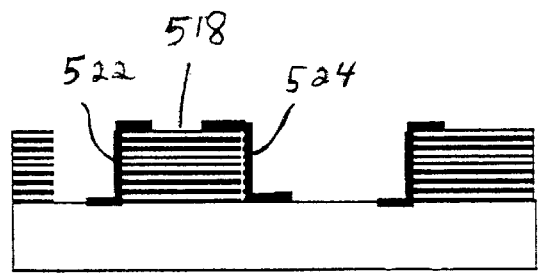

As shown in FIG. 5C, metal 522 is next deposited and patterned on the side of pedestals 518, using a process sequence of patterning, deposition of metal and etching, or, alternatively, a process sequence of patterning, deposition of metal, and lift off. If patterns are steep, directional evaporation may be used without patterning to deposit metal only on one side of the piezoelectric-metal stacks.

As shown in FIG. 5C, the other metal is subsequently etched back (e.g. TiW 90% W+10% Ti weight % etched with 20% $H_2O_2$+water solution). Deposition, patterning and etching of the second metal layer (e.g., Al+Cu) then is carried out, or alternatively a liftoff technique may be employed to form the second strap 524.

Figure 6A:
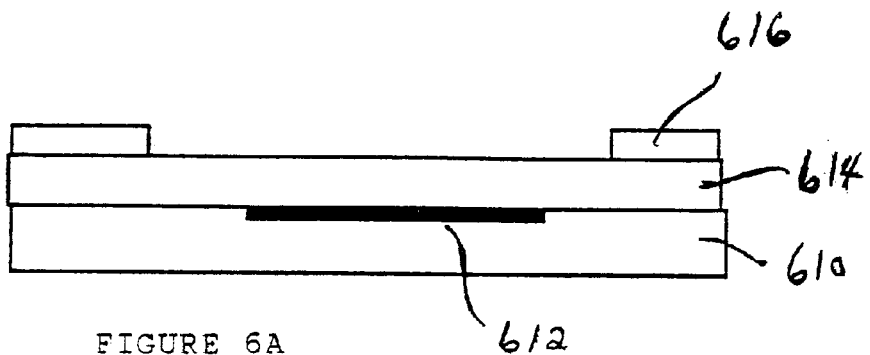
FIGS. 6A–C is a schematic representation of a workpiece process flow, illustrating the fabrication of a micromechanical reflector or reflector array in accordance with one aspect of the present invention.
Figure 6B:
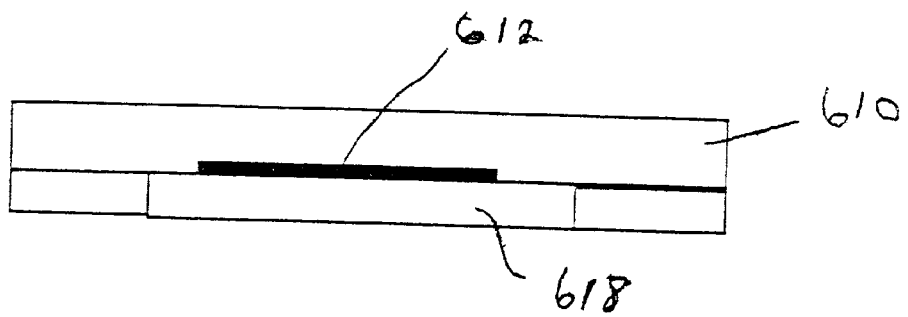
Figure 6C:
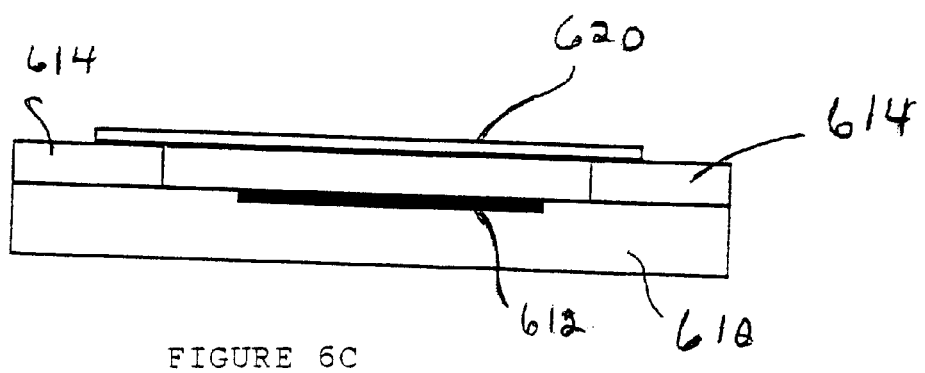

A micromechanical reflector or reflector array may be fabricated in accordance with one aspect of the present invention using the process flow shown in FIGS. 6A–C. The above-described piezoelectric transducers may be incorporated into the micromechanical reflector design, or electrostatic force may simply be used to deflect the mirrors by placing a voltage between the metal on the substrate and the mirror metal. Additional layers of metal or a rigid material such as $Al_2O_3$ or titanium silicide may be placed under the mirror to add rigidity. The top down plan view of these mirrors would be similar to those shown in FIG. 4 hereof. Arrays of these mirrors could be arranged in various other configurations, as necessary or desirable for a specific end use application.

As shown in FIG. 6A, a conductor line 612 is pattern formed on substrate 610 (e.g., a conductor line of aluminum at a thickness of 0.6 microns), followed by the deposition of a material 614 to be used as a standoff (e.g., silica ($SiO_2$), at a thickness of 3 microns). The deposited layer next is patterned (e.g., with resist 616 and lithography).

As shown in FIG. 6B, the standoff material 614 then is etched (e.g., utilizing BOE, RIE, or ultrasonic milling), the resist is removed, and the etched gap 618 is filled in (e.g., by spin on of PMGI and polishing back).

As shown in FIG. 6C, a reflector metal 620 (e.g., aluminum and chromium) is deposited, the metal is patterned with resist, and the metal is etched (e.g., via RIE or by wet etch using a phosphoric+acetic+nitric acid mix), followed by etch out of the fill in material (e.g., using acetone).

Non-reflective optical elements can be substituted for the mirror(s) in the display systems of the present invention to create micromechanical refractive optics. FIGS. 7A–I illustrate various alternative designs embodying such combination of structures, as simple lenses which are easily fabricated using conventional microfabrication techniques.

Figure 7A:
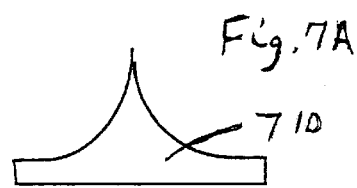
FIGS. 7A–I illustrate various alternative designs embodying such combination of structures, as simple lenses which are easily fabricated using conventional microfabrication techniques.
Figure 7E:
Figure 7B:
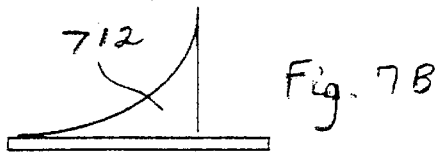
Figure 7F:
Figure 7C:
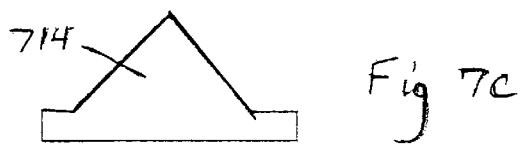
Figure 7G:
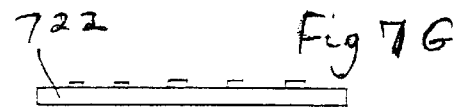
Figure 7D:
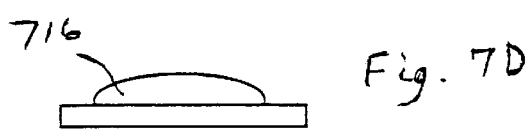
Figure 7H:
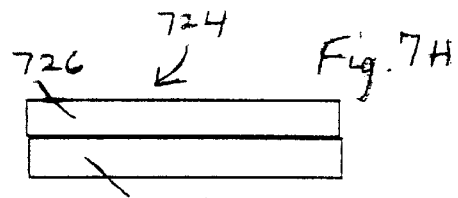
Figure 7I:
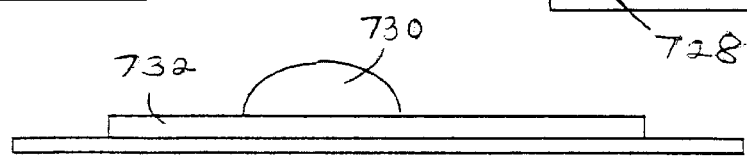

FIG. 7A shows an etched prism lens structure 710, FIG. 7B shows another etched prism lens structure 712, FIG. 7C shows a milled prism lens structure 714, FIG. 7D shows an etched or milled lens structure 716, FIG. 7E shows another etched or milled lens structure 718, FIG. 7F shows an etched or milled multiple prism lens structure 720, FIG. 7G shows an etched diffraction grating or Freznel lens structure 722, FIG. 7H shows a composite lens structure 724, comprising layers 726 and 728 of differing refractive indices, and FIG. 7I shows a lens structure comprising lens 730 mounted on flexible support base 732 on substrate 734.

An optically transmissive conductor could be used to allow electrostatic deflection, while the piezoelectric deflection motor would not require a conductive layer on the optics. All of these structures can be fabricated on $SiO_2$, transparent polymers, or other depositable or laminatable materials. These structures may be formed on the substrate, or fabricated on a sheet elsewhere, and transferred to the substrate. After transfer, such structures could be etched for separation thereof, analogous to fabrication techniques which may be advantageously employed in forming the metal reflector. A flexible material such as aluminum or polymer may advantageously be added to the lenses, or used as a support structure to permit flexing at the joints. The lenses may be rendered optionally reflective on one side thereof by directional evaporation of aluminum thereon.

Figure 8:
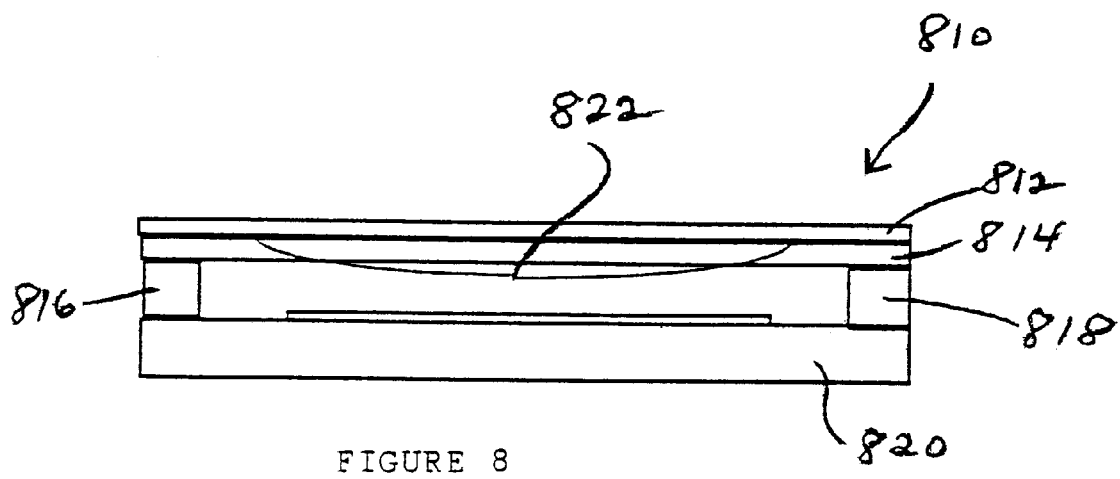
FIG. 8 shows a schematic representation of another embodiment of the invention, wherein electrostatic force is used to deflect the mirrors or lenses.

Deflection of refractive or reflective elements may also be used to focus or move the imaging beams, as is shown in the device illustrated in FIG. 8. In the FIG. 8 embodiment, electrostatic force is used to deflect the mirrors or lenses. For refractive optical systems, transparent conductors such as ITO are used to form capacitors between upper and lower plates. The process used to fabricate these structures may suitably correspond to the process employed to form the structure shown in FIG. 6, and may be implemented as long lines, or in other lens shapes. This fabrication technique provides an opportunity to build electronic focusing directly on the display if desired, and it may also be used for device applications involving deflection and positioning of images.

As illustrated in FIG. 8, the lens structure 810 comprises a two-layer lens assembly comprising first lens layer 812 and second lens layer 814. The two-layer lens assembly is supported on stand-off elements 816 and 818, which in turn are reposed on the substrate 820, as shown. The substrate 820 may be formed of any suitable material, e.g., glass, and if a sufficiently thin substrate is used, both sides of the lens assembly can be constructed and arranged to deflect. As another alternative structural embodiment of the lens structure shown in FIG. 8, the stress in the fabricated assembly may be accurately controlled to permit a natural bow (e.g., along line 822) to be present, which then can be flexed in the operation of the lens structure.

Figure 9A:
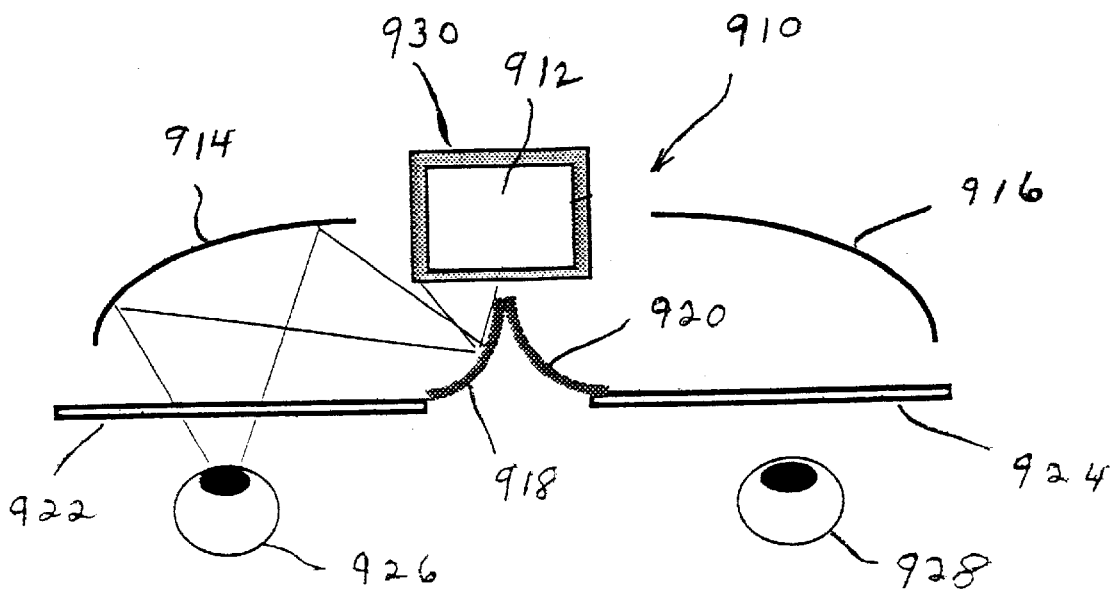
FIG. 9A shows a schematic bottom view of a stereo optics system using a single screen display, according to one embodiment of the invention.

FIG. 9A shows a schematic bottom view of a stereo optics system 910 using a single screen display 912 on a bottom mirror 930, with the eye focusing mirrors 914 and 916 being coactively arranged with respect to the splitter optics elements 918 and 920 and optional optical shutter elements 922 and 924 as illustrated, in relation to the eyes 926 and 928 of the user.

Figure 9B:
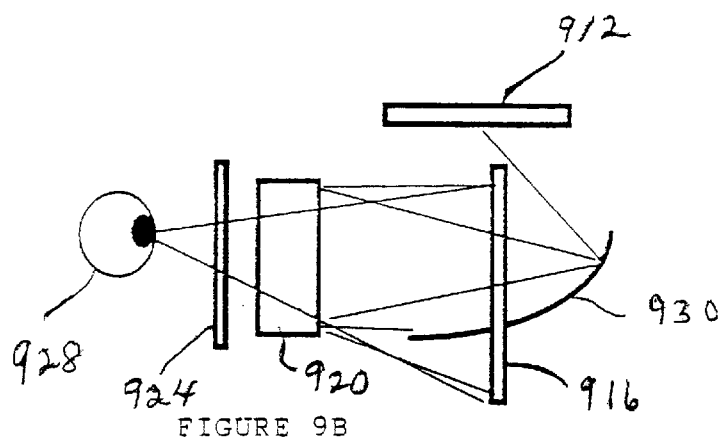
FIG. 9B shows a side view of the optics of the stereo optics system of FIG. 9A.

FIG. 9B shows a side view of the optics of the stereo optics system 910 of FIG. 9A, wherein corresponding elements are correspondingly numbered with respect to FIG. 9A.

In this design an optical shutter 922, 924 is used to switch the image between eyes 926, 928 as the image on the display 912 alternates back and forth (e.g., for a 72 Hz refresh rate to each eye achieving the visual resolution of a high quality monitor, a 2×72=144 Hz refresh would be used).

Without the optional optical shutters in front of the eyes, a non-stereoscopic image would be seen. Several versions of such an optics design may be fabricated. Overlaid real world and virtual images are possible if partially reflective eye focusing mirrors are used. The eye focusing mirror can posses minimal optical effect other than reflection, depending on the design of the other optics components. Position adjustments are required to allow focusing to a specific individual's eyesight, and to correct for interoccular distance.

The entire optics assembly may be placed into a head mountable package, such as in a pair of glasses, or in other eyewear or headgear constructions. Darkened clear plastic for the eye focusing mirror may be used to provide enhanced contrast, while still permitting a real world perimeter view.

If the splitter means is not used, a focusing mirror may be substituted in the above-described stereo optics system design, and a single display image will result. In this case, the eye focusing mirror becomes simply a mirror and would extend fully across the field of view, with the image presented at a center position, or slightly left or right of such center position, depending on viewer preference. Pivots on the bottom mirror or splitter mirror (including the joint between the sides of the splitter mirror) in such single image embodiment, as well as in stereovision embodiments, will permit height, separation, and horizontal position adjustments along with focusing.

An additional element like a Nucolor® filter could be used with a monochrome (with near-white light pixels) field emitter array display, to create a comparatively simple (low electronics parts count) color display. This filter sequentially permits red, green, or blue light therethrough, so that a color image can sequentially be created from a monochrome display, if the display were sequenced to coincide with the color series (with 3 times the normal refresh rate being required to get normal overall refresh rates and a higher brightness display).

Figure 9C:
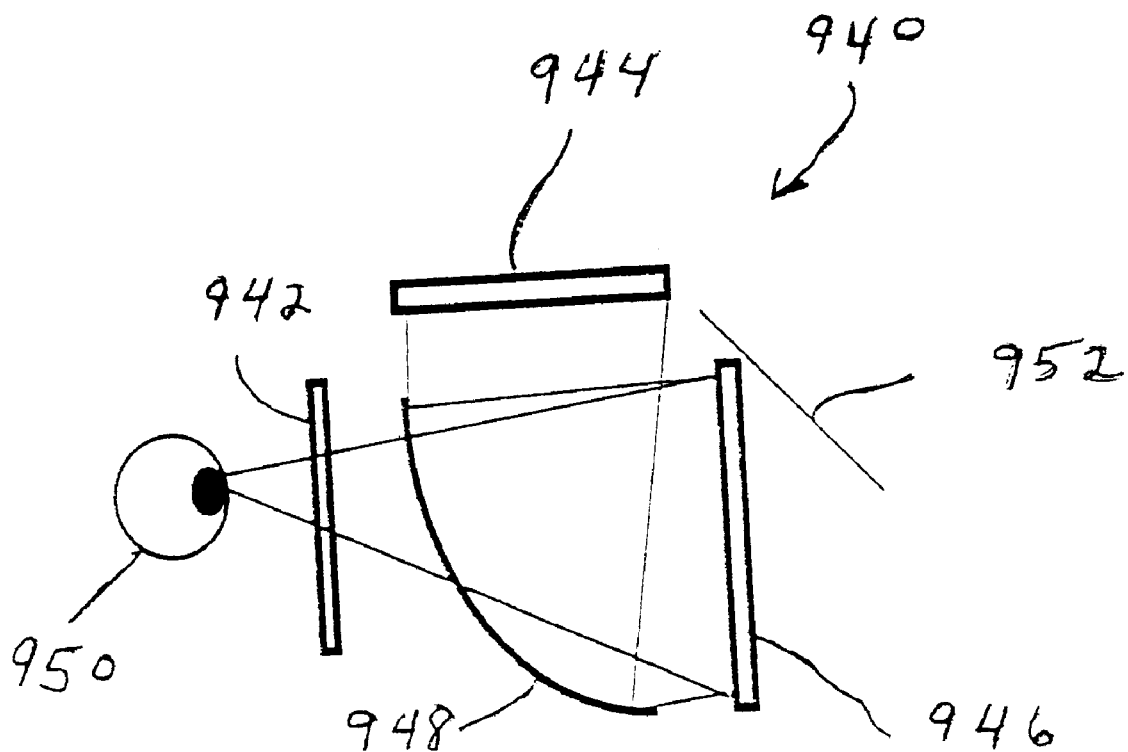
FIG. 9C is a schematic representation of a side view of the optics of an alternative stereo optics system, having an alternative simplified construction relative to the stereo optics system shown in FIG. 9B.

FIG. 9C is a schematic representation of a side view of the optics of an alternative stereo optics system 940, having an alternative simplified construction relative to the stereo optics system shown in FIG. 9B.

In the system 940 of FIG. 9C, a single screen display 944 is provided in operative relationship to the eye focusing mirror 946, splitter mirror 948, optional optical shutter element 924, and optional switchable color filter 952 associated with display 944, as illustrated. The splitter mirror/optics may be combined with a bottom mirror to provide optional focusing.

In operation of the system 940 shown in FIG. 9C, the optical shutter 942 is used to switch the image between the eyes of the user (only eye 950 being shown in the side view of FIG. 9C), as the image on the display 944 alternates back and forth.

In another aspect, the present invention relates to small-scale flat panel displays (e.g., having at least one side dimension of the display panel less than about 10 cm in length), in which the field emitter arrays (FEAs) may for example have an area of approximately 2.5 cm square (2.5 cm on a side), with the FEAs being fabricated on a multi-layer ceramic substrate with internal interconnects. This fabrication approach may be employed in a novel two-dimensional display (of a conventional type, or comprising a scanning display in an imaging system of a type as described hereinabove).

Such small-scale flat panel displays have particular utility in head-mountable display devices according to the invention.

A major design issue in constructing head-mountable display devices comprising small-scale flat panel displays of such type, is the difficulty of connecting high density driver controls to the display. The difficulty of implementing this construction, utilizing currently available integrated circuit technologies, is that the yield of a single driver chip with 64 level or higher gray level control is very small.

In accordance with the present invention, this shortcoming of the prior art is overcome by the fabrication of the FEA on a small multichip module, and flip-chip high line density chips onto the back of the display, utilizing through the substrate via placement which connects to very narrow lines without connecting adjacent lines. By this arrangement, the yields for individual components may be optimized, many electronic functions can be combined on the display, yet the display can be provided in a compact, thin, small-volume structure.

In order to accomplish a high density a very high density connection backside, a very high through the substrate via process is utilized, which is capable of connecting to narrow (e.g., 6–7 microns) lines and rows in the display with small (e.g., <5 microns) spaces. In this process, an insulator layer is deposited on the large filled substrate vias, and then polished to a smooth surface using a tool appropriate to multichip module dielectric planarization over thin film conductors. Small vias are then patterned, and the line and row metallurgies are connected to these vias when they are built. Such technique permits standard size and pitch through the substrate vias to practically connect to a two-dimensional matrix to numerous (e.g., 4096 in an exemplary 2048×2048 display matrix) lines and rows in a small area (e.g., less than 1 square inch) without the requirement and complexities attendant the use of unusual lithography.

Figure 10:
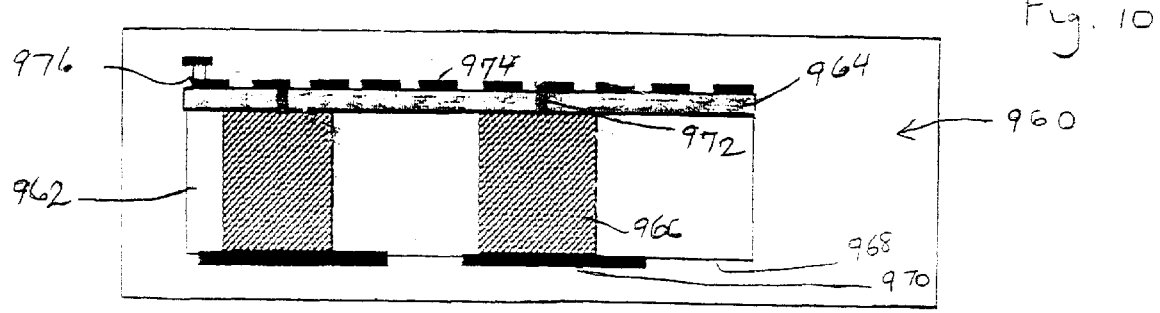
FIG. 10 is a schematic sectional elevational view of a multichip module field emitter display, such as may be usefully employed in the practice of the present invention, and forms another aspect of the invention.
Figure 1:
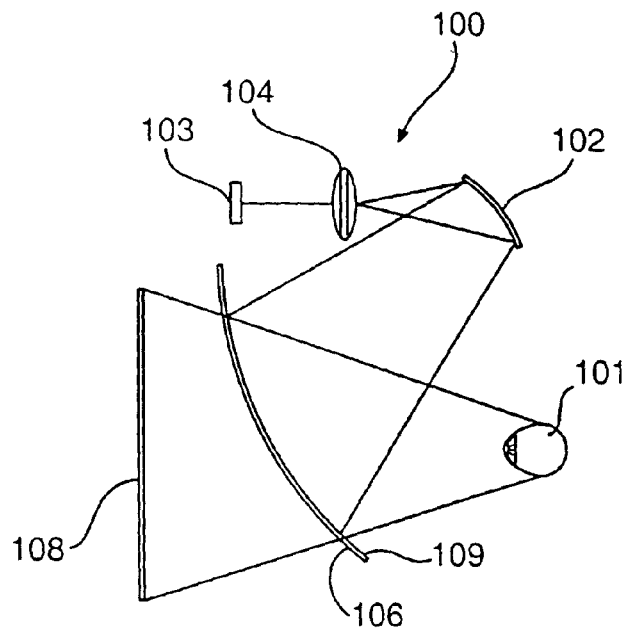
Figure 1A:
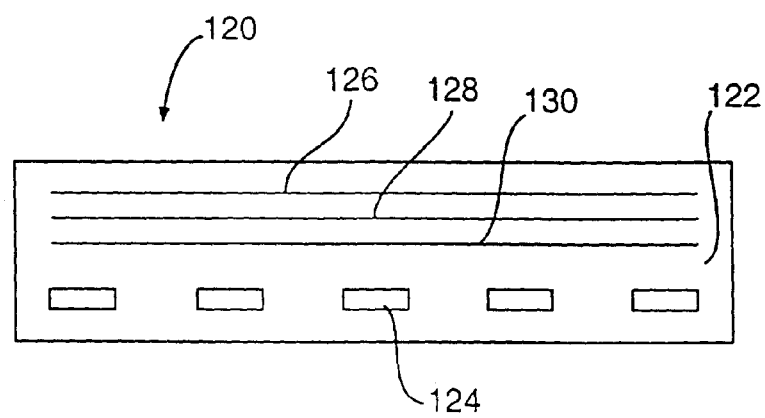
Figure 1B:
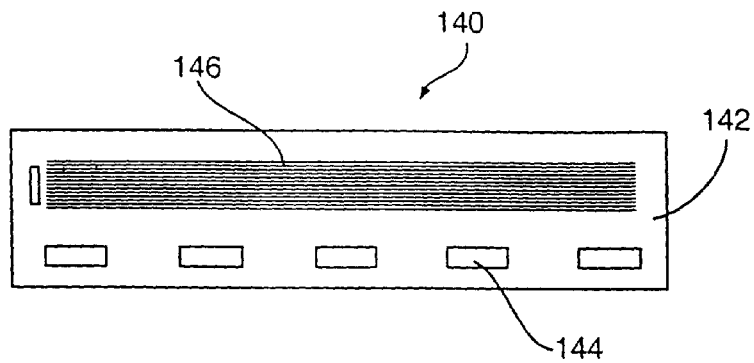
Figure 1C:
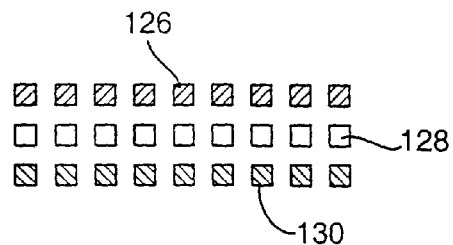
Figure 1D:
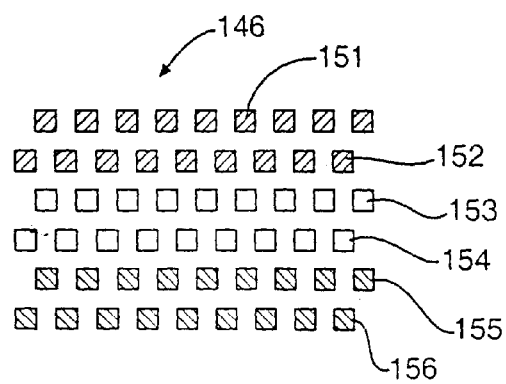

FIG. 10 is a schematic sectional elevational view of a multichip module field emitter display assembly 960, such as may be usefully employed in the practice of the present invention, and forms another aspect of the invention. As shown in such drawing, the assembly 960 comprises a bulk glass or ceramic substrate 962 on the top surface of which is provided a layer of deposited insulator 964. Extending vertically through the substrate 962 are large through substrate vias 966, coupled on the bottom surface 968 of the substrate with backside connectors 970, with optional added insulators, conductive layers, or vias. For example, the backside connectors 970 in this embodiment may be contiguously arranged in relation to a dielectric layer array comprising interlayer conductor lines, and with vias through the respective dielectric layers and in conductively coupled relationship to the backside connectors 970.

Extending vertically through the deposited insulator layer 964 are small line/row matrix select vias 972, coupling the large through substrate vias 966 with the conductors 974 for the lines/rows. The conductors 974 in turn are connected by the via 976 to the gate level.

Since many displays may be built from one multichip module plate of the above-described type, and the driver interconnects in such assembly are integral components thereof, the foregoing fabrication technique permits high resolution display units to be mass produced in a very economical and reproduceable manner.

The backside connection in the above-described display devices may advantageously use vertically conducting elastomeric conductors, in addition to conventional flip-chip techniques.

In displays of the above-described type, wherein the small pixel pitch requires tight electron trajectory control, electron spreading is reduced by small gate opening sizes which reduce the lateral electron energy component, by reducing the required extraction gate voltage. Low work function coatings, e.g., of carbon, may be employed to achieve extraction gate voltage levels on the order of 30 volts or lower, even with gate openings of significant diameter, e.g., over 1.5 microns. High anode voltages may also be employed for achieving tight electron trajectories while improving multispectral brightness and energy efficiency.

Figure 11:
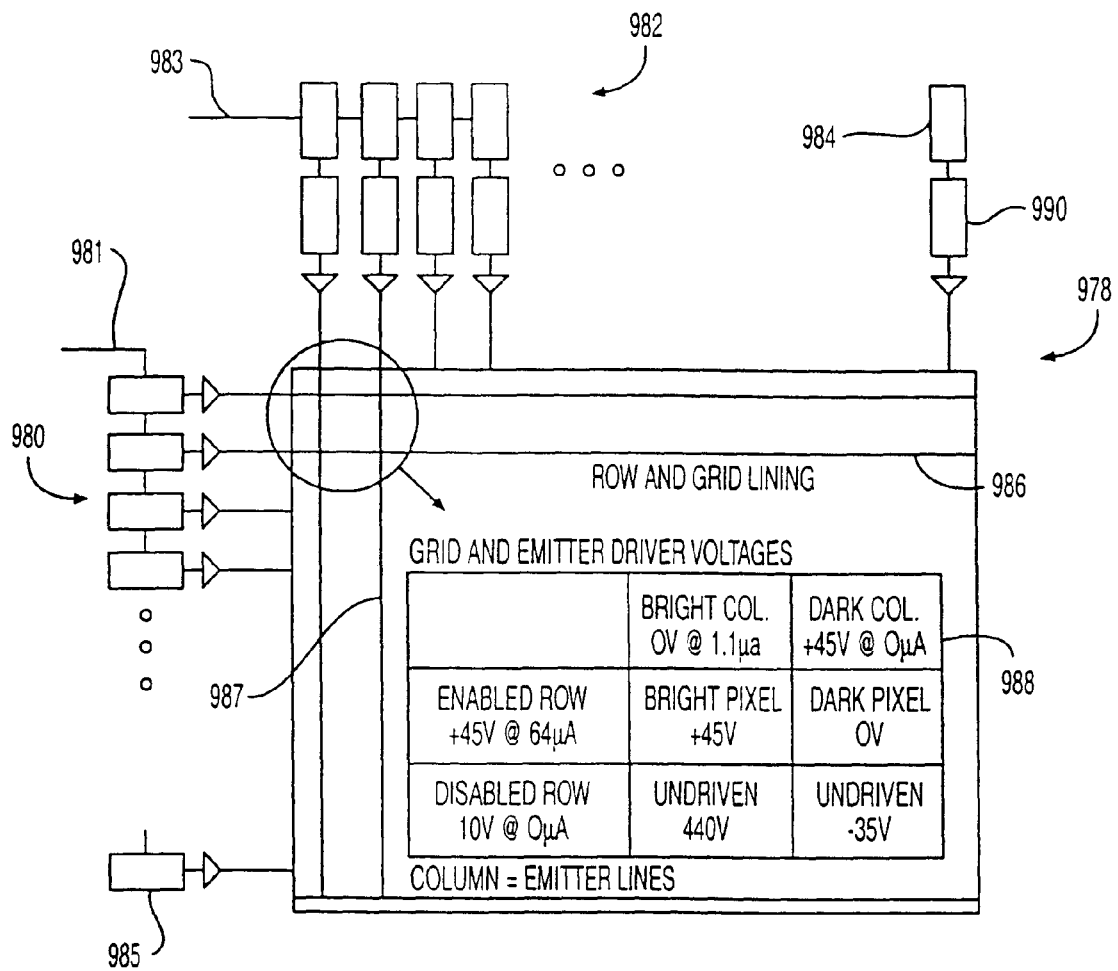
FIG. 11 is a schematic representation of a row and column driver assembly, such as may be utilized in a field emitter display device according to another embodiment of the invention.

FIG. 11 is a schematic representation of a row and column driver assembly 978, such as may be utilized as a part of the electrical interface for an FEA. The assembly 978 comprises row driver subassembly 980 receiving row enable signal 981, and column driver subassembly 982 receiving video data input signal 983. In this arrangement, the row subassembly 980 provides the driver means for the grid lines of the display, and the column subassembly 982 provides the driver means for the emitter lines of the display. The driver means for the column emitter lines 987 comprise pulse width modulator elements 990 in operative relationship to shift register elements 984 of the driver. The row driver subassembly 980 includes shift register elements 985 in the drivers for the row grid lines 986.

The grid and emitter driver voltages are permutatively interrelated in the table 988 superposed on the row/column driver assembly 978 for ease of reference. In this table, the grid (row) and column (emitter) line driver voltages are identified: Enabled Row, +45 volts at 64 microamperes (uA); Disabled Row, 10 volts at 0 microamperes; Bright Column, 0 volts at 1.1 microamperes; and Dark Column, +45 volts at 0 microamperes. For these driver voltage values, the following output obtains:

| Voltage Combinations | Output |
|---|---|
| Enabled Row, +45 volts at 64 uA; Bright Column, 0 volts at 1.1 uA | Bright Pixel, +45 volts |
| Enabled Row, +45 volts at 64 uA; Dark Column, +45 volts at 0 uA | Dark Pixel, 0 volts |
| Disabled Row, 10 volts at 0 uA; Bright Column, 0 volts at 1.1 uA | Undriven, +10 volts |
| Disabled Row, 10 volts at 0 uA; Dark Column, +45 volts at 0 uA | Undriven, −35 volts |

In use of the assembly 978 shown in FIG. 11, when an entire row has been loaded into the shift register, all of the pixels are transferred to the pulse width modulators, which are counters. From the time the counter is loaded until the count reaches zero, the driver is enabled. 6 bit data is brought into the driver for gray level control at 64 levels. The switching driver voltage is applied to each pixel in a row for a time proportional to the value of the pixel which causes the intensity of the pixel to be also proportional to the pixel value. To ensure that a single row is affected by the data, the row drivers apply a high voltage to one row at a time. This is controlled by the shifting a single logic one down the row driver shift register.

Figure 12:
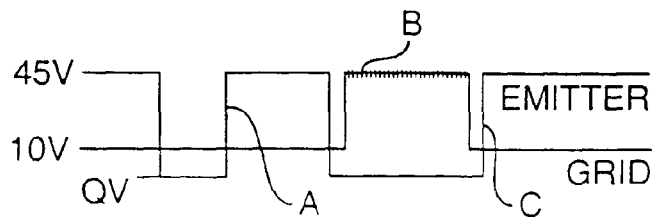
FIG. 12 is a schematic representation of an address control system such as may be usefully employed in a field emitter display device according to a further aspect of the invention.

FIG. 12 is a schematic representation of an address control system such as may be usefully employed in a field emitter display device comprising the row and column driver assembly shown in FIG. 11.

In FIG. 12, the emitter and gate voltage levels are shown in relation to one another, over the address regime. As shown at point A, in a non-selected regime, the bias is opposite the point emission (10–15 V). At point B, a gray control on the gate is shown. At point C, there is an overlap to ensure that the gate controls the gray level.

As an example of the two-dimensional field emitter display device having the aspects and features variously shown in FIGS. 10–12 above, a field emitter display device may be provided comprising a high-definition 2048×2048 high speed, low power flat-panel video display which is directly integrated with system electronics of the overall system. In this field emitter display device, having 4,194,304 display pixels in the 2048×2048 video array, the pixel pitch is 12.2 μm, the refresh rate is ≧60 Hz, and the active area is 2.5 cm×2.5 cm (~3.54 cm diagonal). In this illustrative embodiment, the overall substrate area is 4.0 cm×3.0 cm (20 units per 166 mm square substrate). The dark ambient contrast is >100:1 and CRT-like in character. The display thickness with drivers is ≦2.5 cm, the power consumption, with drivers included, at 50% brightness with 50% of the pixels full on can be less than 1 watt. The brightness level can be as bright as 20 FL white, with a brightness range of from about $10^{-4}$ to about 20 FL, and with an operating temperature level of from about −50 degrees Centigrade to about +80 degrees Centigrade, depending on the electronics used to support the operation of the display.

The display panels of the present invention may usefully comprise a through the substrate matrix address approach which will permit high density connection between the backside electronics and frontside lines and rows, with direct integration of driver and other electronics on the backside of the display, and with easily interchangeable display electronics. The display panels are readily fabricatable at relatively low cost, since the driver electronics is integrated in a small display, yet yielded separately. Multichip module cost is low since many displays are simultaneously produceable from one substrate.

Such display panels advantageously utilize a high speed, high line density integrated driver chip set usefully adapted to body-mountable display-type field emitter devices. The chip set can be readily designed to interface to a CCD camera and data source minimizing the volume and power consumption of the system, and other intermediate electronics.

The emitter structures may be readily fabricated using known patterning fabrication techniques, including laser interference processes, high resolution lithography (X-ray lithography), laser interference patterning, to provide sub-micron sized gate field emitter arrays. For example, the gate openings may be on the order of 0.1 micron, which permits low voltage operation to be achieved, and also provides a system in which a small lateral energy component is imparted to emitted electrons.

When laser interference patterning is employed, high density arrays of small dots (e.g., 1/10th micron diameter dots, and smaller) can be simultaneously patterned over a multiplicity of FEAs. By this patterning, gated emitters are only formed where the lines intersect, so alignment problems are minimized.

The emitter structures may be usefully fabricated by a process in which emitter tip elements are produced from evaporated silicon. While a number of materials of construction may be used for the emitter tip elements, silicon affords good process control and choice of fabrication processes as an emitter material. The silicon is suitably deposited on conductive leads which are covered with a highly resistive cermet material. Following etching, the insulator is formed around the emitter while the emitter cap is still in place. A gate sandwich of insulator-metal-insulator is deposited which self-aligns to the emitter. A remote plasma carbon film may be deposited on the surface to lower the work function. These processes are predominantly self-aligning in character, with only three mask levels being required for the FEA. There is no need for an additional mask pattern on the resistor when etched emitter elements of highly uniform size and shape are employed, since the vertical resistance of the structure obviates such requirement.

In the fabrication of the emitter elements, e.g., at an emitter density on the order of 200 emitter elements/pixel, an isolation structure is usefully provided by coating of an insulator on top of gate metal in the array of gated field emitter elements, with the insulator layer extending to the edge of the gate, as well as extending all the way to the edge of the emitter plate member on which the emitter elements are formed. Such "to the edge" insulator fabrication on the emitter plate provides an isolation structure which may also be employed for standoff purposes, and the prevention of flashover. An illustrative insulator material for such construction is silicon monoxide (SiO), although any suitable insulator material may usefully be employed. In addition, a low work function material may be coated on the insulator to aid in focusing of the emitted electron beams in use of the resulting FEA. By way of example, a 50–200 Angstrom layer of carbon or niobium may be utilized, with "dot" masking on the insulator, in which an open dot is provided for each pixel.

In this fabrication, the emitter elements are formed in preferably regular arrays, in which the emitter is arranged to generally vertically upwardly extend from the appertaining support or base structure. The emitter in such array is associated with a resistor layer and alternating insulator and dielectric (e.g., SiO and $SiO_2$) layers, and the structure, e.g., of a type as more fully described in my copending U.S. patent application Ser. No. 08/029,880 filed Mar. 11, 1993 for "FIELD EMISSION DEVICE EMITTER TIP STRUCTURE AND METHOD OF MAKING THE SAME," the disclosure of which hereby is incorporated herein by reference, may be selectively etched with respect to the gate metal so as to minimize flashover, while at the same time enhancing focusing, by the provision of an insulator material layer on the gate metal, as previously described.

Previously, matrix display type products have relied on soldered, thermal/compression bonded connectors or used integrated electronics on the display (i.e., thin film transistors). For very small displays, such as those on the order of 1 inch square, the number of lines and line pitch make these approaches impractical. The display panel devices of the present invention therefore contemplate direct interconnection structure for interconnecting the display and driver electronics, without a transition wire bond or other unreliable connection means. Specifically, connection may be made in the panels of the present invention by metal to metal deposition directly to the vias of the ceramic carrier. The construction method used for such purpose involve the passage of large high reliability vias through the substrate and connection to high density lines by small vias without shorting neighboring lines.

Such arrangement permits a substantial reduction in the number of interconnections, the integrity of the metal to metal fusion type connections, and the intimate association of the electronics within the same assembly significantly enhance the reliability and flexibility of the display, relative to display products of the prior art. The panel structure of the present invention thus provides an integrated assembly with a co-fired ceramic circuit substrate to be made from a composition permitting glass to ceramic sealing with minimal residual stress, and also serving as an FEA substrate.

The electronics for driving the row and column control lines will be mounted on the backside of the assembly. The interconnections to the FEA and the ceramic base will be reliably formed by direct connection of the metalized control lines to the via in the substrate material. Stacking components may be employed to increase the number of chips in the body mountable display without increasing perimeter area of the display. The translation of the row, column to the appropriate driver will be provided by the layer of the co-fired ceramic. This design provides a short, low capacitance interconnection that reduces drive line power and improves switching times. To control the large number of row, column drivers in such a small area requires high integration drive devices.

In the processing of the substrate, the integrated substrate advantageously comprises a co-fired ceramic providing via connections to which the FEA interconnects are metallized. The ceramic then is polished flat and smooth so that no significant process changes imaging of the FEA. A silicon imaging of the FEA. A silicon dioxide coating is sputtered on the substrate, following which the substrate is repolished. The substrate next is patterned and etched to open the vias. The vias will be gradually sloped or filled with metal prior to deposition of the emitter line metal. Openings are cut to permit gate lines to be connected after emitter and insulator processing. The backside of the ceramic has bond pads provided thereon to accept the display driver devices in bare die form. A connector is provided for interface to a suitable driver source, e.g., a PC video driver.

The anode structures used in field emitter displays in accordance with the present invention may comprise a phosphor plate of any suitable construction, including for example $Y_2O_2S$:Tb phosphor plates providing defect-free fine grain phosphor films (~1 micron) with high energy efficiency at low voltage operation (e.g., 10–15 L/W at ~2 kilovolts).

The field emitter flat panel displays of the present invention may suitably comprise various other features and aspects, including for example: sandwich gate structures with low leakage and low capacitance characteristics; vertical cermet resistors providing uniformity, defect immunity, and blowout protection; ultra-low work function carbon emitter surfaces for low voltage turn-on and minimal electron energy spread with concurrent minimal emitter contamination sensitivity; low capacitance emitters for high speed and minimal power loss due to line charging; and high voltage dielectric isolation structures for small gap display plates to minimize spot size and maximize brightness and energy efficiency.

The use of self-aligned gated point emitter structures in the flat panel displays of the present invention affords significant advantages in terms of electron trajectory control, minimizing parasitic line capacitance, and minimizing turn-on voltage for any given work function surface due to the electric field enhancement optimized at a vertical point.

The anode power to gate or emitter power ratio in flat panel FEA display devices according to the present invention may be on the order of 10,000:1. This power ratio value is substantially better than is achievable in most LCD systems, and orders of magnitude better than systems in which the driver must power the light generation at each pixel. Accordingly, the display panel FEA structure of the present invention permits the driver to be of a low power, low cost character.

Display panels in accordance with the present invention may suitably comprise a getter material of suitable shape, e.g., a shaped barium getter, placed on one side of the display in such manner as to direct the getter away from the array, yet not short the anode to the array. Such technique will provide a large getter surface permitting high power operation while maintaining superior vacuum conditions in the interior volume of the panel array device.

The electronics for the displays utilized in the practice of the present invention are usefully designed in the form of boards or modules which can be easily connected and disconnected from the rear of the main display, thereby permitting the display's "smart" function portion to be modified with minimal effort.

The body (head) mountable display systems of the present invention may be utilized in a wide variety of applications, including the military applications of lightweight communication, navigation, avionics, instrument viewing, and data access, nightvision, rear view, and laser threat protection, stereovision in remote situations (e.g., landing helicopters, robotics control), ability to be visually elsewhere (such as on a missile, at multiple stakeout locations, a commander on a battlefield, a soldier at command while really in the battlefield, etc.), ability of a senior engineer to be on site to inspect and troubleshoot a complex situation without travelling, enhanced intelligence capability, the ability to link with weapons such as gun sites, and environmental simulation for training and in vision impaired environments, etc.

In addition, commercial applications are numerous, including viewing for portable computers, the ability to utilize computers which can be hung on a belt or fitted into a pocket, the ability of the screen to be fixed to the head of a user and to be immune to vibration, reducing motion sickness potential, the ability to provide a big screen monitor, multiple monitors, or big screen TV, enhanced privacy of viewing, increased ease of integrating viewing screens with earphones, virtual reality games and applications, educational applications, medical applications (aids for the visually impaired, psychiatric therapy, needle surgery with overlaid ultrasound images, computer generated images, physician training and cooperation, and paramedic assistance), the ability to conduct virtual meetings, instant (virtual or linked) experts on site, computer aided design, police work, entertainment with peripheral and stereovision, virtual shopping, etc.

While the invention has been illustratively shown and described herein, with reference to various specific embodiments of the invention, it will be appreciated that the invention may be variously alternatively configured, arranged, and used, and that numerous alternative features, aspects and embodiments are possible within the scope of the invention as disclosed herein.

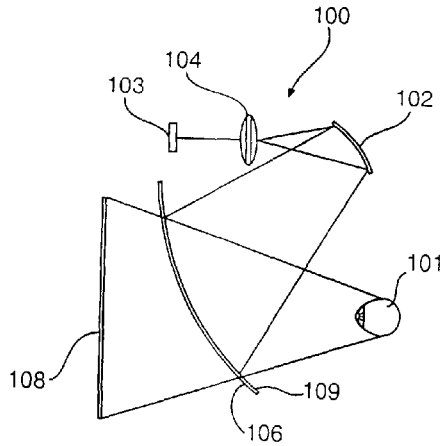

What is claimed is:

1. A scanned display apparatus comprising:

a display screen having an asymmetrical display surface;

a pixel array comprising a plurality of field emitter elements including lines of red, green, and blue pixels, wherein each line contains at least one field emitter element and displays only a single color pixel, wherein said pixel array includes a ceramic substrate member having a multiplicity of through substrate conductive vias therein, an insulative material layer on said ceramic substrate having a multiplicity of through layer conductive vias formed therein; an addressable array of gate and emitter line elements on the insulative material layer, conductively coupled to said multiplicity of through substrate conductive vias through said multiplicity of said through layer conductive vias; a backside connector on the ceramic substrate member and conductively coupled to said multiplicity of through substrate vias, and said plurality of field emitter elements being located on said insulative material, wherein each of the field emitter elements of the array is operatively coupled with the addressable array of gate and emitter line elements;

an actuator arranged for selectively activating the pixels in the lines to exhibit information, wherein said backside connector is operatively connected to said actuator; and a scanning mechanism generating a two dimensional image by scanning the lines of selectively activated pixels onto the asymmetrical display surface of said display screen sequentially in stepped positions by line on the asymmetrical display surface of said display screen, wherein said asymmetrical display surface of said display screen focuses an image to be viewed by a user.

2. The scanning display apparatus according to claim 1, wherein said scanning mechanism includes a single mirror for generating the two dimensional image on said asymmetrical surface of said display screen.

3. The scanning display apparatus according to claim 1, wherein said asymmetrical display surface of said display screen focuses an image to be viewed by a user such that said scanning display apparatus produces a virtual image spaced from said display screen.

4. The scanning display apparatus according to claim 1, wherein said scanning display apparatus is capable of being worn on a head mountable display.

5. A scanned display apparatus comprising:

a display screen;

a pixel array comprising a plurality of field emitter elements including lines of red, green, and blue pixels, wherein each line contains at least one field emitter element and displays only a single color pixel, wherein said pixel array includes a ceramic substrate member having a multiplicity of through substrate conductive vias therein, an insulative material layer on said ceramic substrate having a multiplicity of through layer conductive vias formed therein; an addressable array of gate and emitter line elements on the insulative material layer, conductively coupled to said multiplicity of through substrate conductive vias through said multiplicity of said through layer conductive vias; a backside connector on the ceramic substrate member and conductively coupled to said multiplicity of through substrate vias, and said plurality of field emitter elements being located on said insulative material, wherein each of the field emitter elements of the array is operatively coupled with the addressable array of gate and emitter line elements;

an actuator arranged for selectively activating said pixels in said lines to exhibit information, wherein said backside connector is operatively connected to said actuator; and a scanning mechanism generating a two dimensional image by scanning said lines of selectively activated pixels onto said display screen sequentially in stepped positions by line on said display screen, wherein said display screen focuses an image to be viewed by a user such that said scanning display apparatus produces a virtual image spaced from said display screen.

6. The scanning display apparatus according to claim 5, wherein said display screen is an asymmetrical display surface.

7. The scanning display apparatus according to claim 5, wherein said scanning mechanism includes a single mirror for generating the two dimensional image on said display screen.

8. The scanning display apparatus according to claim 5, wherein said scanning display apparatus is capable of being worn on a head mountable display.

* * * * *

UNITED STATES PATENT AND TRADEMARK OFFICE
CERTIFICATE OF CORRECTION

PATENT NO. : 5,903,243
DATED : May 11, 1999
INVENTOR(S) : Gary W. Jones

It is certified that error appears in the above-identified patent and that said Letters Patent is hereby corrected as shown below:

Delete the title page and substitute the attached title page.

Delete drawings sheets 1-12 and substitute the attached drawing sheets 1-14.

Signed and Sealed this

Fourth Day of February, 2003

JAMES E. ROGAN
*Director of the United States Patent and Trademark Office*

United States Patent [19]
Jones

[11] Patent Number: 5,903,243
[45] Date of Patent: *May 11, 1999

[54] COMPACT, BODY-MOUNTABLE FIELD EMISSION DISPLAY DEVICE, AND DISPLAY PANEL HAVING UTILITY FOR USE THEREWITH

[75] Inventor: Gary W. Jones, Raleigh, N.C.

[73] Assignee: Fed Corporation, Hopewell Junction, N.Y.

[*] Notice: This patent issued on a continued prosecution application filed under 37 CFR 1.53(d), and is subject to the twenty year patent term provisions of 35 U.S.C. 154(a)(2).

[21] Appl. No.: 08/778,747

[22] Filed: Jan. 6, 1997

Related U.S. Application Data

[63] Continuation of application No. 08/290,238, Aug. 15, 1994, abandoned, which is a continuation-in-part of application No. 08/029,880, Mar. 11, 1993, abandoned.

[51] Int. Cl.$^6$ .................................................. G09G 5/00
[52] U.S. Cl. .................................................. 345/7; 345/74
[58] Field of Search .............................. 345/7, 8, 9, 74, 345/75, 76; 348/196, 201–205; 313/351, 352; 315/169.1, 169.3

[56] References Cited

U.S. PATENT DOCUMENTS

| | | | |
|---|---|---|---|
| 3,665,241 | 5/1972 | Spindt et al. | 313/351 |
| 3,753,022 | 8/1973 | Fraser, Jr. | 313/78 |
| 3,921,022 | 11/1975 | Levine | 313/309 |
| 3,935,500 | 1/1976 | Oess et al. | 313/495 |
| 3,970,887 | 7/1976 | Smith et al. | 313/309 |
| 3,982,147 | 9/1976 | Redman | 313/309 |
| 3,998,678 | 12/1976 | Fukase et al. | 156/3 |
| 4,008,412 | 2/1977 | Yuito et al. | 313/309 |
| 4,095,133 | 6/1978 | Hoeberechts | 313/336 |
| 4,227,883 | 10/1980 | Kaplan | 29/571 |
| 4,256,532 | 3/1981 | Magdo et al. | 156/628 |
| 4,307,507 | 12/1981 | Gray et al. | 29/580 |
| 4,325,000 | 4/1982 | Wolfe et al. | 313/336 |
| 4,337,115 | 6/1982 | Ikeda et al. | 156/659.1 |
| 4,498,952 | 2/1985 | Christensen | 156/643 |
| 4,513,308 | 4/1985 | Greene et al. | 357/55 |
| 4,531,122 | 7/1985 | Redfield | 340/781 |
| 4,578,614 | 3/1986 | Gray et al. | 313/309 |
| 4,614,564 | 9/1986 | Sheldon et al. | 156/657 |
| 4,670,090 | 6/1987 | Sheng et al. | 156/653 |
| 4,683,024 | 7/1987 | Miller et al. | 156/643 |
| 4,685,996 | 8/1987 | Busta et al. | 156/628 |
| 4,724,328 | 2/1988 | Lischke | 250/492.2 |
| 4,774,433 | 9/1988 | Ikebe et al. | 313/362.1 |
| 4,824,795 | 4/1989 | Blanchard | 437/62 |
| 4,853,545 | 8/1989 | Rose | 250/396 R |
| 4,869,575 | 9/1989 | Kubik | 345/8 |
| 4,934,773 | 6/1990 | Becker | 345/8 |
| 4,964,946 | 10/1990 | Gray et al. | 156/643 |

(List continued on next page.)

FOREIGN PATENT DOCUMENTS 58-94741  6/1983  Japan .............................. H01J 27/02

OTHER PUBLICATIONS

Warren, J. B., "Control of Silicon Field Emitter Shape with Isotropically Etched Oxide Masks", Inst. Phys. Conf. Ser. No. 99, Section 2, pp. 37–40.

*Primary Examiner*—Xiao Wu
*Attorney, Agent, or Firm*—Collier, Shannon, Rill & Scott, PLLC

[57] ABSTRACT

An imaging apparatus for providing an image from a display to an observer, comprising: a display generating an optical output, an imaging surface member constructed and arranged for viewing by said observer, and a scanning mirror/lens assembly optically interposed between the display and the imaging surface member, and constructed and arranged to motively repetitively scan the display, generate a scanned image, and transmit the scanned image to the imaging surface member, for viewing of the scanned image. Various field emitter display designs and subassemblies are described, which may be usefully employed in such imaging apparatus.

8 Claims, 12 Drawing Sheets